(12) United States Patent
Miyake

(10) Patent No.: US 11,094,553 B2
(45) Date of Patent: Aug. 17, 2021

(54) SEMICONDUCTOR DEVICE AND MANUFACTURING METHOD

(71) Applicant: SONY SEMICONDUCTOR SOLUTIONS CORPORATION, Kanagawa (JP)

(72) Inventor: Shinichi Miyake, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 34 days.

(21) Appl. No.: 16/485,702

(22) PCT Filed: Feb. 22, 2018

(86) PCT No.: PCT/JP2018/006416
§ 371 (c)(1),
(2) Date: Aug. 13, 2019

(87) PCT Pub. No.: WO2018/163839
PCT Pub. Date: Sep. 13, 2018

(65) Prior Publication Data
US 2019/0393049 A1 Dec. 26, 2019

(30) Foreign Application Priority Data
Mar. 8, 2017 (JP) .............................. JP2017-043811

(51) Int. Cl.
*H01L 23/60* (2006.01)
*H01L 21/3205* (2006.01)
(Continued)

(52) U.S. Cl.
CPC ...... *H01L 21/3205* (2013.01); *H01L 21/3065* (2013.01); *H01L 21/768* (2013.01);
(Continued)

(58) Field of Classification Search
CPC ............ H01L 21/3205; H01L 27/0255; H01L 21/3065; H01L 21/768; H01L 23/522;
(Continued)

(56) References Cited

U.S. PATENT DOCUMENTS 6,365,939 B1    4/2002  Noguchi
2006/0226485 A1*  10/2006  Arakawa ............. H01L 27/0251
257/347
(Continued)

FOREIGN PATENT DOCUMENTS

CN          1845331 A      10/2006
JP       2000-216259 A      8/2000
(Continued)

OTHER PUBLICATIONS

International Search Report and Written Opinion of PCT Application No. PCT/JP2018/006416, dated Apr. 17, 2018, 08 pages of ISRWO.

*Primary Examiner* — Shih Tsun A Chou
(74) *Attorney, Agent, or Firm* — Chip Law Group

(57) ABSTRACT

The present technology relates to a semiconductor device and a manufacturing method that make it possible to reduce PID. The semiconductor device includes a first layer, a second layer laminated with the first layer, a conductive member that comes into contact with a lateral surface of a groove part formed in the first layer and the second layer, and first wiring that is formed in the second layer and comes into contact with a bottom surface of the groove part. The conductive member is connected to a protecting element for discharging charges accumulated inside the groove part. The present technology is applicable to, for example, the formation of a via in a silicon substrate and an interlayer film laminated with each other.

12 Claims, 18 Drawing Sheets

(51) Int. Cl.
    *H01L 21/3065*   (2006.01)
    *H01L 21/768*   (2006.01)
    *H01L 21/822*   (2006.01)
    *H01L 23/522*   (2006.01)
    *H01L 27/02*   (2006.01)
    *H01L 27/06*   (2006.01)

(52) U.S. Cl.
    CPC .......... *H01L 21/822* (2013.01); *H01L 23/522* (2013.01); *H01L 23/60* (2013.01); *H01L 27/0255* (2013.01); *H01L 27/0629* (2013.01)

(58) Field of Classification Search
    CPC .......................... H01L 23/60; H01L 23/5225; H01L 21/76898
    See application file for complete search history.

(56) References Cited

U.S. PATENT DOCUMENTS

2014/0225209 A1\*   8/2014  Kasai ................ H01L 31/02005
                                             257/428
2017/0338203 A1\*  11/2017  Yuan ................. H01L 23/53295

FOREIGN PATENT DOCUMENTS

| | | |
|---|---|---|
| JP | 2006-294719 A | 10/2006 |
| JP | 2008-210952 A | 9/2008 |
| JP | 2011-086850 A | 4/2011 |
| JP | 2015-216194 A | 12/2015 |
| JP | 2016-197759 A | 11/2016 |
| KR | 10-2006-0107280 A | 10/2006 |

\* cited by examiner

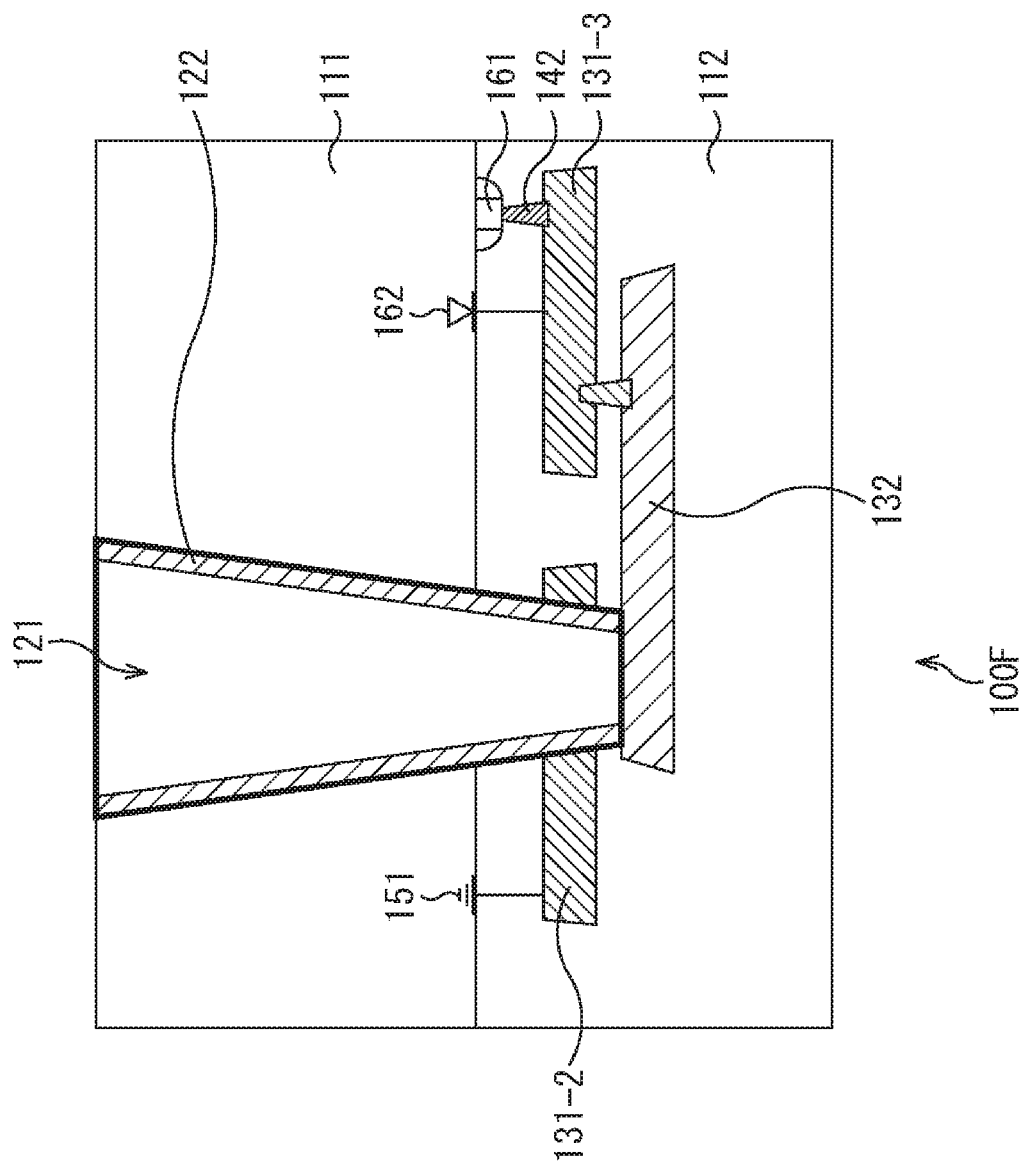

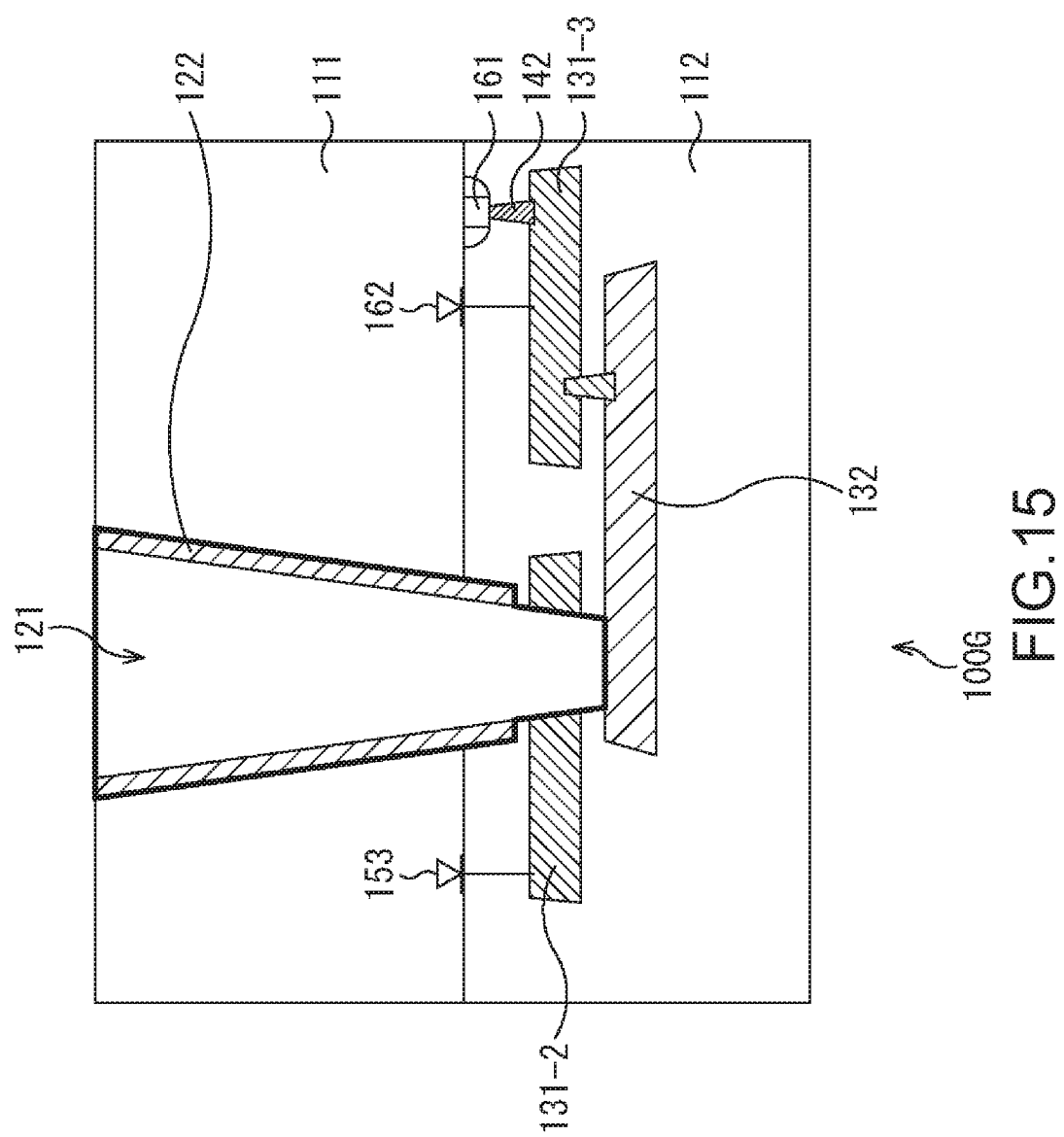

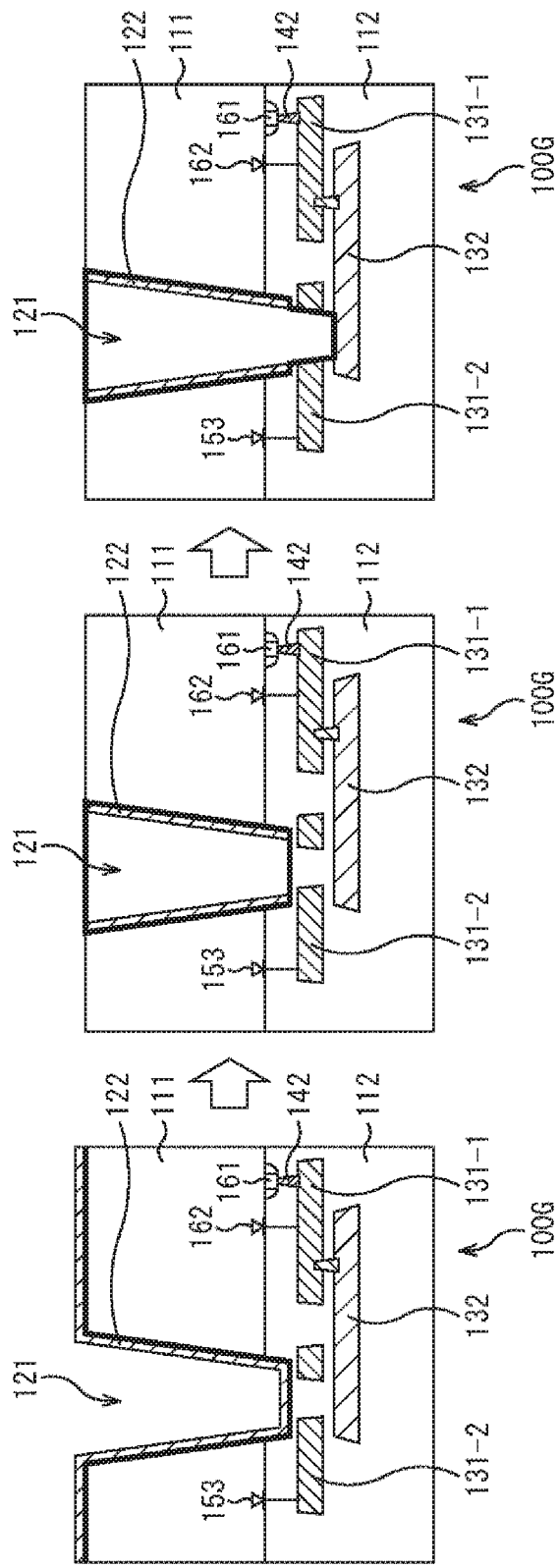

SEMICONDUCTOR DEVICE AND MANUFACTURING METHOD

CROSS REFERENCE TO RELATED APPLICATIONS

This application is a U.S. National Phase of International Patent Application No. PCT/JP2018/006416 filed on Feb. 22, 2018, which claims priority benefit of Japanese Patent Application No. JP 2017-043811 filed in the Japan Patent Office on Mar. 8, 2017. Each of the above-referenced applications is hereby incorporated herein by reference in its entirety.

TECHNICAL FIELD

The present technology relates to a semiconductor device and a manufacturing method and, in particular, to a semiconductor device and a manufacturing method that make it possible to reduce PID.

BACKGROUND ART

In recent years, the microfabrication of semiconductor devices has been advanced. It has been known that the characteristic variations of transistors are caused in semiconductor devices due to large PID (Plasma Induced Damage) when vias having high aspect ratios are formed (see, for example, Patent Literature 1).

CITATION LIST

Patent Literature

Patent Literature 1: Japanese Patent Application Laid-open No. 2015-216194

DISCLOSURE OF INVENTION

Technical Problem

Meanwhile, it is assumed that the gate areas of transistors will be reduced by the microfabrication of semiconductor devices in the future. However, since a large number of protecting elements are required to protect the transistors with an increase in an antenna ratio with respect to wiring and vias, there will be a demand for a reduction in PID itself.

The present technology has been made in view of the above circumstances and makes it possible to reduce PID.

Solution to Problem

A semiconductor device according to an aspect of the present technology includes: a first layer; a second layer laminated with the first layer; a conductive member that comes into contact with a lateral surface of a groove part formed in the first layer and the second layer; and first wiring that is formed in the second layer and comes into contact with a bottom surface of the groove part, in which the conductive member is connected to a protecting element for discharging charges accumulated inside the groove part.

In a semiconductor device according to an aspect of the present technology, a conductive member that comes into contact with a lateral surface of a groove part formed in a first layer and a second layer laminated with each other is connected to a protecting element for discharging charges accumulated inside the groove part, and first wiring is connected to a bottom surface of the groove part.

A method for manufacturing a semiconductor device according to an aspect of the present technology includes: laminating a first layer and a second layer with each other; forming a conductive member on the second layer so as to come into contact with a lateral surface of a groove part formed in the first layer and the second layer; forming a protecting element for discharging charges accumulated inside the groove part so as to be connected to the conductive member; forming first wiring in the second layer so as to come into contact with a bottom surface of the groove part; and performing etching on the first layer and the second layer laminated with each other from a side of the first layer to form the groove part.

In a method for manufacturing a semiconductor device according to an aspect of the present technology, a first layer and a second layer are laminated with each other, a conductive member is formed on the second layer so as to come into contact with a lateral surface of a groove part formed in the first layer and the second layer, a protecting element for discharging charges accumulated inside the groove part is formed so as to be connected to the conductive member, first wiring is formed in the second layer so as to come into contact with a bottom surface of the groove part, and etching is performed on the first layer and the second layer laminated with each other from a side of the first layer to form the groove part.

Advantageous Effects of Invention

According to an aspect of the present technology, PID can be reduced.

Note that the effect described here is not necessarily limitative and any effect described in the present disclosure may be produced.

BRIEF DESCRIPTION OF DRAWINGS

FIG. 13 is a view describing the structure of the semiconductor device of a tenth embodiment.

FIG. 15 is a view describing the structure of the semiconductor device of an eleventh embodiment.

FIGS. 16A, 16B, and 16C are views each describing a method for manufacturing the semiconductor device of the eleventh embodiment.

MODE(S) FOR CARRYING OUT THE INVENTION

Figure 1:
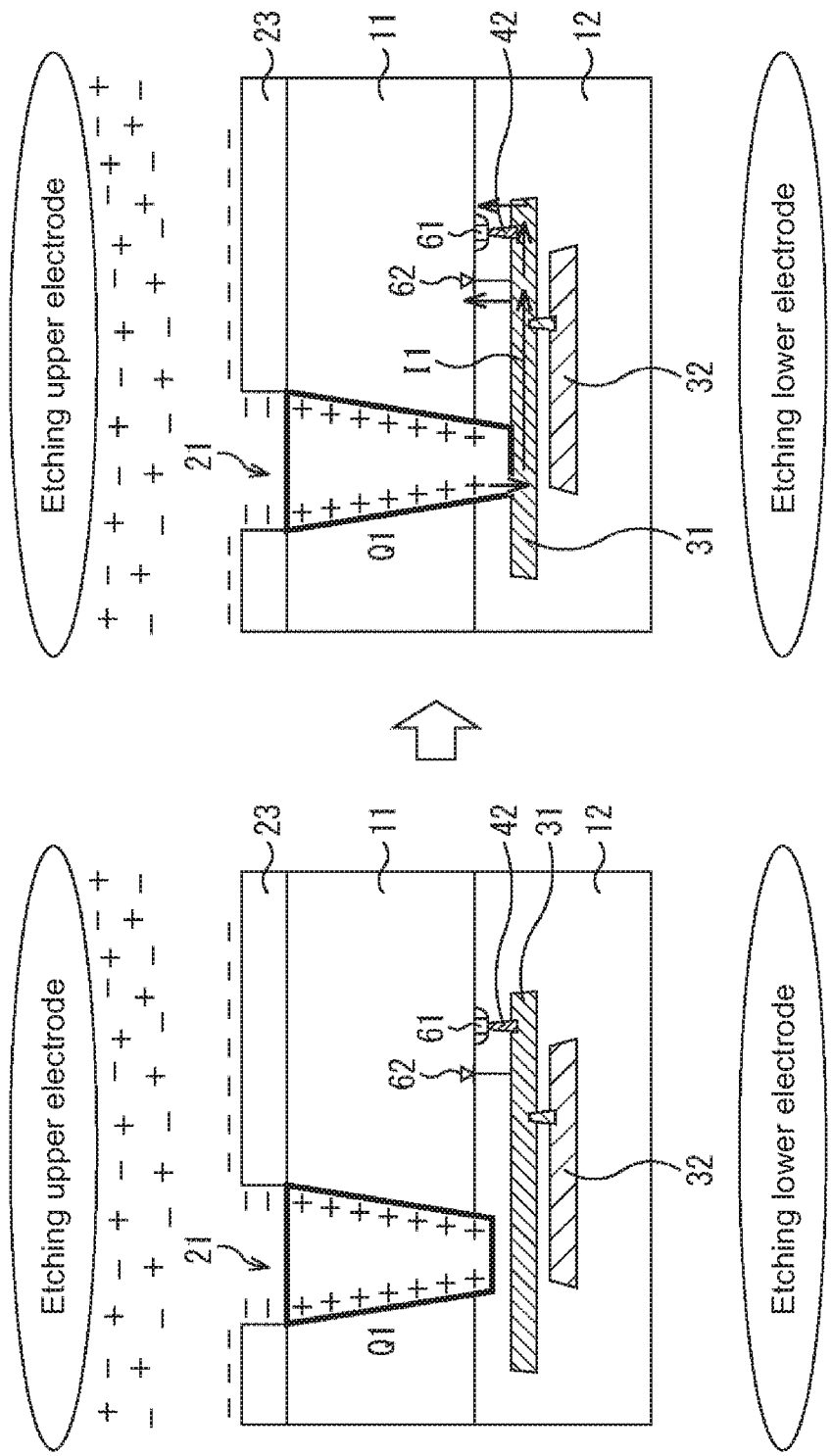
FIGS. 1A and 1B are views each describing a PID mechanism in a conventional technology.

Hereinafter, embodiments of the present technology will be described with reference to the drawings. Note that the description will be given in the following order.

1. Outline of Present Technology
2. First Embodiment: Structure in which contact comes into contact with lateral surface of via and is connected to ground
3. Second Embodiment: Structure in which contact comes into contact with lateral surface of via and is connected to forward diode
4. Third Embodiment: Structure in which contact comes into contact with lateral surface of via and is connected to reverse diode
5. Fourth Embodiment: Structure in which contact surrounds lateral surface of via
6. Fifth Embodiment: Structure in which contact comes into contact with part of lateral surface of via
7. Sixth Embodiment: Structure in which first gate electrode comes into contact with lateral surface of via and is connected to ground
8. Seventh Embodiment: Structure in which second gate electrode comes into contact with lateral surface of via and is connected to ground
9. Eighth Embodiment: Structure in which gate electrode surrounds lateral surface of via
10. Ninth Embodiment: Structure in which gate electrode comes into contact with part of lateral surface of via
11. Tenth Embodiment: Structure in which first wiring comes into contact with lateral surface of via and is connected to ground
12. Eleventh Embodiment: Structure in which first wiring comes into contact with lateral surface of via and part coming in contact with lateral surface of via is not covered with insulating film
13. Twelfth Embodiment: Structure in which first wiring surrounds lateral surface of via
14. Thirteenth Embodiment: Structure in which first wiring comes into contact with part of lateral surface of via
15. Modified Examples

1. Outline of Present Technology

In the manufacturing process of a semiconductor device, dry etching, CVD (Chemical Vapor Deposition), or the like is generally performed under a plasma excitation gas to form, for example, wiring or a via connected to the gate electrode of a transistor.

Therefore, positive charges or negative charges are electrified on the gate electrode to cause the characteristic variations of the transistor, which results in the possibility of the unintended behavior of a circuit. The phenomenon is called PID (Plasma Induced Damage), plasma damage, or the like.

(Conventional PID Mechanism)

FIGS. 1A and 1B are views each describing a PID mechanism in a conventional technology.

FIGS. 1A and 1B schematically show a process in which, when a silicon substrate 11 and an interlayer film 12 are laminated with each other and a via 21 is formed, a resist 23 is coated on the side of the upper surface of the silicon substrate 11 and processing is performed by dry etching from the side of the silicon substrate 11.

When the process is performed, the upper electrode and the lower electrode of the etching are provided and the etching is performed under the application of a bias. At this time, electrons (−) are generally likely to be accumulated on the surface of the resist 23, and etchant ions (+) are electrified on the lateral surface (lateral wall) of the via 21 to be processed.

Note that "−" in the figures shows electrons and is characterized in that directivity is low. On the other hand, "+" in the figures shows etchant ions and is characterized in that directivity is high.

Further, first wiring 31 and second wiring 32 are formed as conductive body layers in the interlayer film 12. The first wiring 31 is connected to a transistor 61 via a contact 42 and further connected to a protecting diode 62.

As shown in FIG. 1A, charges Q1 are accumulated and electrified on the lateral surface (lateral wall) of the via 21 by an electron shading effect when the insulating film of the via 21 having a high aspect ratio is formed. As a result, a voltage inside the via 21 becomes high.

Then, as shown in FIG. 1B, the charges Q1 accumulated inside the via 21 flow into the side of the circuit at the moment at which the bottom surface (bottom part) of the via 21 comes into contact with the first wiring 31 as the etching of the via 21 is advanced.

That is, a current I1 corresponding to the charges Q1 accumulated on the lateral surface of the via 21 flows into the first wiring 31, and a current that cannot be processed by the protecting diode 62 flows into the gate electrode of the transistor 61 connected to the contact 42. As a result, the characteristic variations of the transistor 61 are caused.

As described above, the conventional technology employs a configuration in which the protecting diode 62 is connected with respect to the transistor 61 to release the current I1 flowing into the side of the circuit to the side of the silicon substrate 11. However, if PID is large, the protecting diode 62 is required to be large correspondingly.

Meanwhile, it is assumed that the gate area of the transistor 61 will be reduced by the microfabrication of the logic of the semiconductor device in the future. Therefore, since a large number of the protecting diodes 62 is required with an increase in an antenna ratio with respect to the via 21, there will be a demand for a reduction in PID itself.

Figure 2:
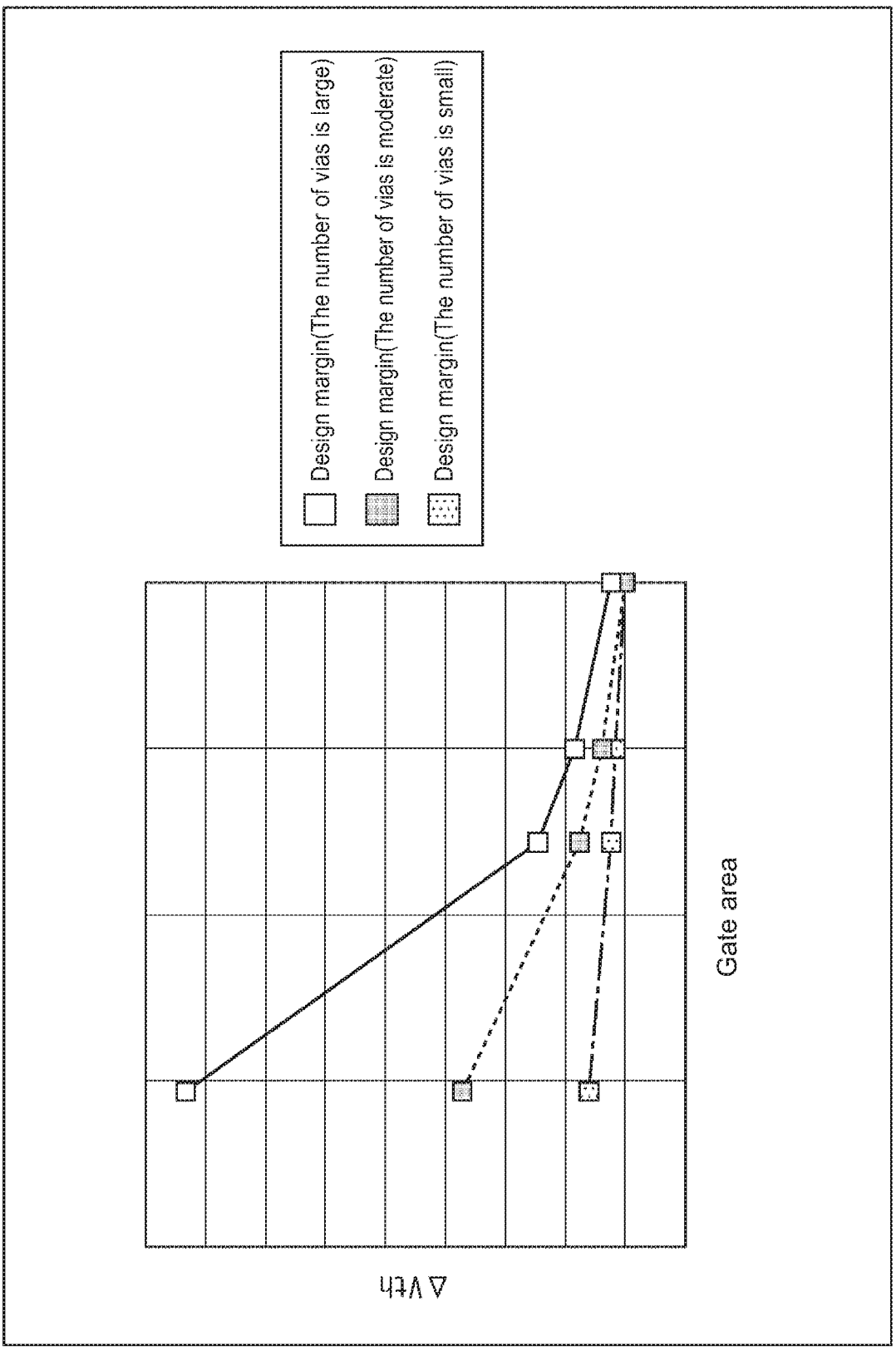
FIG. 2 is a diagram describing a state in which a threshold voltage depends on a gate area due to PID in a transistor.

Specifically, FIG. 2 shows a relationship in which a threshold voltage depends on a gate area due to PID in a transistor.

Note that in FIG. 2, a horizontal axis expresses the gate area of the transistor 61 and shows that the area becomes larger from the left side to the right side of the figure. That is, the gate area is headed in the left side direction of the horizontal axis with the microfabrication of the logic. Further, a vertical axis expresses the threshold voltage of the transistor 61 and shows that the difference (ΔVth) becomes larger as the threshold voltage is headed from the lower side to the upper side of the figure.

FIG. 2 shows three folded lines each showing the relationship between the threshold voltage and the gate area of the transistor 61. A first folded line shows the relationship between the threshold voltage and the gate area obtained when the number of the vias 21 is large, that is, when the area of the vias is large as a design margin. Similarly, a second folded line shows the relationship obtained when the number of the vias 21 is small, and a third folded line shows the relationship obtained when the number of the vias 21 is moderate between a case in which the number of the vias 21 is large and a case in which the number of the vias 21 is small.

From these relationships well, it is apparent that the threshold voltage (ΔVth) of the transistor 61 increases due to the PID when the gate area of the transistor 61 reduces with the advancement of the microfabrication of the logic of the semiconductor device. On the other hand, since the vias 21 between laminated chips are not microfabricated, an antenna ratio increases (the tendency becomes remarkable particularly when the number of the vias 21 is large).

As a countermeasure for the problem, the reinforcement of the function of the protecting diode 62 or a reduction in the PID itself of the vias between the laminated chips is required.

Accordingly, the present technology proposes the structure of a semiconductor device that makes it possible to reduce PID as the latter countermeasure among the above countermeasures. Specifically, the present technology aims at realizing a PID mechanism as shown in FIGS. 3A 3B, and 3C.

(PID Mechanism of Present Technology)

FIGS. 3A, 3B, and 3C are views each describing a PID mechanism obtained when the present technology is applied.

FIGS. 3A, 3B, and 3C schematically show a process in which, when a silicon substrate 111 serving as a semiconductor layer and an interlayer film 112 serving as a conductive body layer are laminated with each other and a via 121 is formed in a semiconductor device 100, a resist 123 is coated and processing is performed by dry etching from the side of the silicon substrate 111.

When the process is performed, the upper electrode and the lower electrode of the etching are provided and the etching is performed under the application of a bias. As described above, electrons (−) are generally likely to be accumulated on the surface of the resist 123, and etchant ions (+) are electrified on the lateral surface (lateral wall) of the via 121 to be processed. Note that in FIGS. 3A, 3B, and 3C, "−" in the figures shows electrons and "+" in the figures shows etchant ion like FIGS. 1A and 1B.

A BEOL (Back End Of Line) interlayer film or the like can be, for example, used as the interlayer film 112. First wiring 131-1, first wiring 131-2, and first wiring 131-3 and second wiring 132 are formed in the interlayer film 112.

The first wiring 131-1 and the second wiring 132 are connected to each other, and the second wiring 132 is connected to the first wiring 131-3. Further, the first wiring 131-3 is connected to a transistor 161 via a contact 142 and further connected to a protecting diode 162.

The second wiring 131-2 is connected to a contact 141 formed so as to come into contact with a partial region of the lateral surface (lateral wall) of the via 121. Further, the first wiring 131-2 is connected to ground (GND) 151 and grounded to the silicon substrate 111.

As shown in FIG. 3A, charges Q2 are accumulated and electrified on the lateral surface (lateral wall) of the via 121 by an electron shading effect when the insulating film of the via 121 having a high aspect ratio is formed.

Here, etching is performed from the side of the silicon substrate 111 to form the via 121. However, halfway through the etching, the lateral surface (lateral wall) of the via 121 comes into contact with the contact 141 before the bottom surface (bottom part) of the via 121 comes into contact with the first wiring 131-1.

Thus, (some) of the charges Q2 accumulated on the lateral surface (lateral wall) of the via 121 flows to the side of the silicon substrate 111 via the contact 141 and the first wiring 131-2 as a current I3. As a result, the charges Q2 inside the hole (via hole) of the via 121 can be reduced.

Therefore, the comparison between the charges Q1 (FIG. 1A) on the lateral surface of the via 21 in the conventional technology and the charges Q2 (FIG. 3A) on the lateral surface of the via 121 in the present technology shows the relationship Q2<Q1. Accordingly, the via 121 in the present technology makes it possible to reduce an electric field compared with the via 21 in the conventional technology.

Then, as shown in FIG. 3B, the charges Q2 accumulated inside the via 121 flow into the side of the circuit at the moment at which the bottom surface of the via 121 comes into contact with the first wiring 131 as the etching of the via 121 is advanced. That is, a current I2 corresponding to the charges Q2 accumulated on the lateral surface of the via 121 flows into the first wiring 131-1, and then flows into the first wiring 131-3 via the second wiring 132.

At this time, the comparison between the current I1 (FIG. 1B) corresponding to the charges Q1 in the conventional technology and the current I2 (FIG. 3B) corresponding to the charges Q2 in the present technology shows the relationship I2<I1. Accordingly, it becomes possible to reduce the current I2 flowing into the first wiring 131-3.

Therefore, the current I2 (reduced current I2) flowing into the first wiring 131-3 is satisfactorily processible by the protecting diode 162 and prevented from flowing into the side of the gate electrode of the transistor 161 connected to the contact 142. As a result, the characteristic variations of the transistor 161 can be suppressed in advance.

As described above, in the present technology, a conductive layer (conductive member) such as the contact 141 comes into contact with the lateral surface (lateral wall) of the via 121 before the first wiring 131-1 connected to an internal circuit and the bottom surface of (bottom part) of the via 121 come into contact with each other to release the charges (charges Q2) accumulated on the lateral surface (the lateral wall) of the via 121 to the ground (GND) via the contact 141 (the conductive member) and the first wiring 131-2 (wiring).

At this time, the charges Q2 accumulated on the lateral surface (lateral wall) of the via 121 are reduced compared with the case in which the conventional technology shown in FIGS. 1A and 1B is used. Therefore, when the bottom surface (bottom part) of the via 121 comes into contact with the first wiring 131-1, the current I2 flowing into the internal circuit can be reduced. As a result, the expansion of the protecting function of the protecting diode 162 can be suppressed with a reduction in PID itself, and thus it becomes possible to satisfactorily respond to a demand for the microfabrication of the logic of the semiconductor device 100.

After that, when the etching is finished, the lateral surface of the via 121 is once covered with an insulating film 122 such as a silicon nitride film (SiN) and a silicon oxide film (SiO$_2$) as shown in FIG. 3C. Then, etching is selectively performed so as to make only the insulating film 122 on the lateral surface of the via 121 remain.

That is, the contact 141 and the first wiring 131-2 are electrically separated from other conductive members by the protection of the lateral surface (lateral wall) of the via 121 with the insulating film 122. Then, a conductive member such as copper (Cu) and tungsten (W) is, for example, embedded in the via 121.

Next, the structure of a semiconductor device 100 which includes the above PID mechanism of the present technology and to which the present technology is applied will be described. Hereinafter, each of structures shown in first to thirteenth embodiments that allow a reduction in PID will be described as the structure of the semiconductor device 100 to which the present technology is applied.

2. First Embodiment

Figure 4:
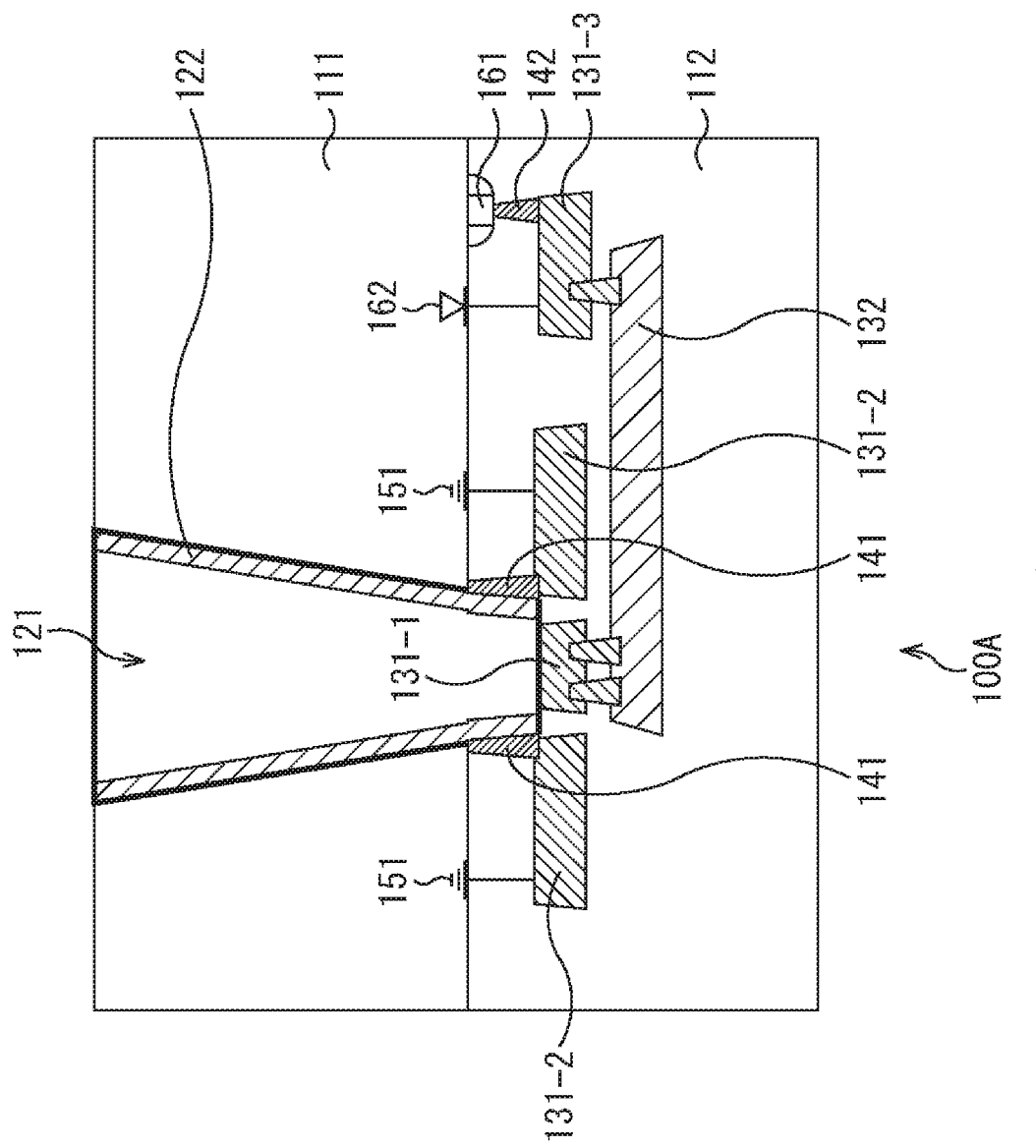
FIG. 4 is a view describing the structure of the semiconductor device of a first embodiment.

FIG. 4 is a view describing the structure of the semiconductor device of a first embodiment.

Note that FIG. 4 shows a cross-sectional view of a part of the structure of a semiconductor device 100A as the first embodiment. However, portions corresponding to those of the semiconductor device 100 of FIGS. 3A 3B, and 3C are denoted by the same symbols in the semiconductor device 100A of FIG. 4, and the descriptions of the corresponding portions will be appropriately omitted.

In FIG. 4, a silicon substrate 11 and an interlayer film 112 are laminated with each other, and a via 121 is formed in the semiconductor device 100A.

The via 121 is used as, for example, a TSV (Through Silicon Via), or the like. A partial region of the bottom surface of the via 121 comes into contact with first wiring 131-1. Further, a contact 141 is formed so as to come into contact with a partial region of the lateral surface of the via 121 but electrically separated from other conductive members by an insulating film 122.

The first wiring 131-1 is connected to second wiring 132 formed in the lower layer of the first wiring 131-1. The second wiring 132 is connected to first wiring 131-3 formed in the same layer as the first wiring 131-1. The first wiring 131-3 is connected to a transistor 161 via a contact 142 and further connected to a protecting diode 162.

The contact 141 is connected to ground (GND) 151 via the first wiring 131-2 and grounded to the silicon substrate 111. For example, the grounding method is realized in such a manner that the contact 141 comes into contact with a P-type well or a P-type diffusion layer inside the silicon substrate 11 or the contact 141 comes into contact with an N-type well or an N-type diffusion layer inside the silicon substrate 111.

Here, when the semiconductor device 100A is manufactured, etching is performed from the side of the silicon substrate 111 to form the via 121. However, halfway through the etching, the lateral surface of the via 121 comes into contact with the contact 141 before the bottom surface of the via 121 comes into contact with the first wiring 131-1.

That is, the via 121 and the contact 141 that have been etched from the side of the silicon substrate 111 first come into contact with each other at the lateral surface of the via 121, and some of charges accumulated inside the hole (via hole) of the via 121 flows to the side of the silicon substrate 111 via the contact 141 and the first wiring 131-2 according to an electron shading effect. Thus, the charges inside hole (via hole) of the via 121 are reduced.

As described above, the lateral surface of the via 121 comes into contact with the contact 141 in the etching process for forming the via 121, whereby an electric field inside the via 121 can be reduced.

After that, a part of the bottom surface of the via 121 and the first wiring 131-1 come into contact with each other as the etching of the via 121 is advanced, and the charges inside the hole (via hole) of the via 121 flow into a subsequent-stage circuit (for example, the transistor 161 or the like) via the first wiring 131-1.

At this time, a current flowing into the subsequent-stage circuit via the first wiring 131-1 is also reduced since the electric field has been already reduced (the electric field inside the hole is reduced compared with the case in which the conventional technology shown in FIGS. 1A and 1B is used) by the contact between the lateral surface of the via 121 and the contact 141. Thus, the expansion of the protecting function of the protecting diode 162 can be suppressed with a reduction in PID itself.

After the etching is finished, the lateral surface of the via 121 is protected by an insulating film 122 such as a silicon nitride film (SiN). Thus, as shown in FIG. 4, the contact 141 and the first wiring 131-2 are electrically separated from other conductive members. Then, a conductive member such as copper (Cu) is, for example, embedded in the via 121.

The semiconductor device 100A of the first embodiment is described above.

3. Second Embodiment

Figure 5:
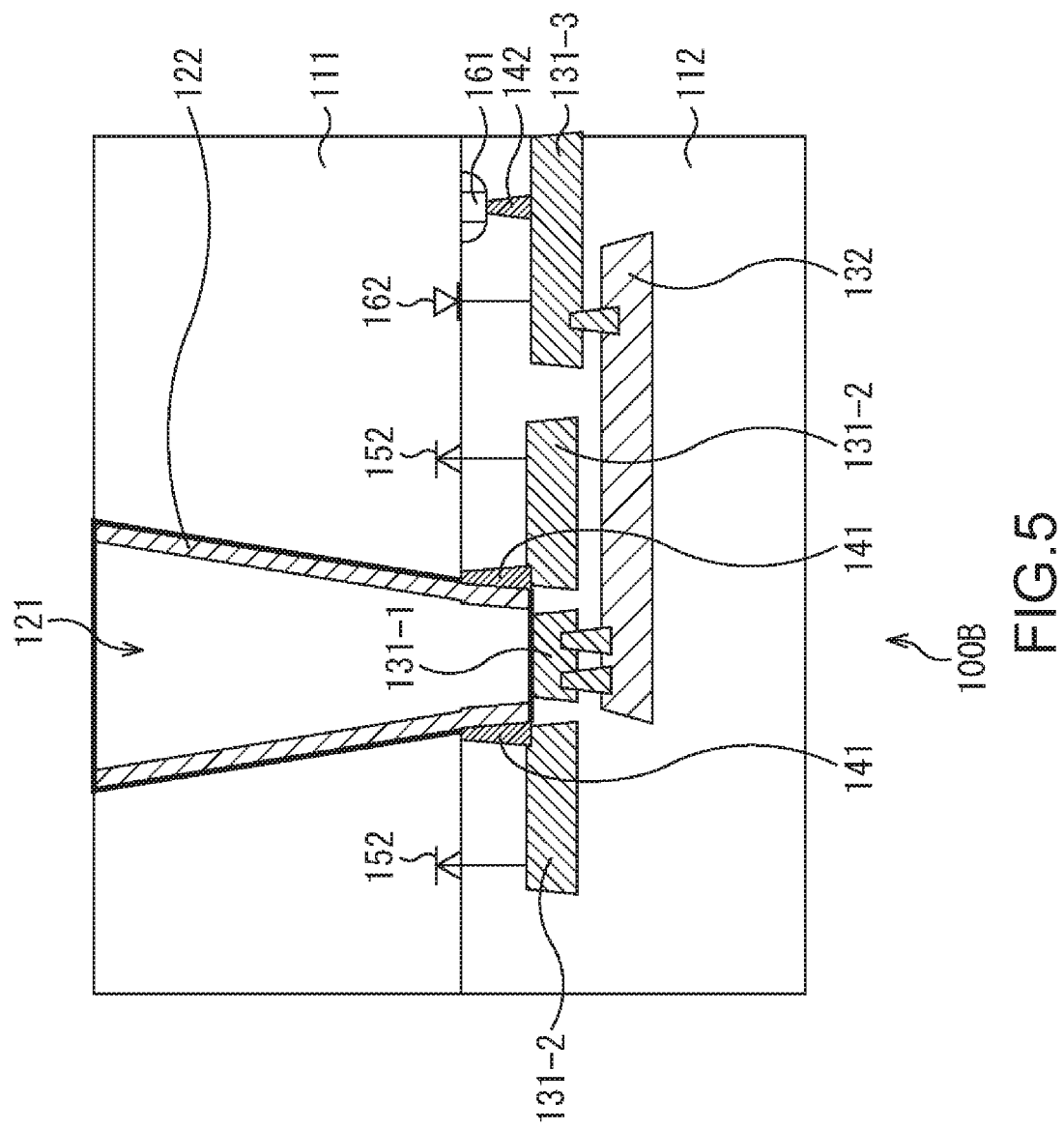
FIG. 5 is a view describing the structure of the semiconductor device of a second embodiment.

FIG. 5 is a view describing the structure of the semiconductor device of a second embodiment.

Note that FIG. 5 shows a cross-sectional view of a part of the structure of a semiconductor device 100B as the second embodiment. However, portions corresponding to those of the semiconductor device 100 of FIGS. 3A 3B, and 3C are denoted by the same symbols in the semiconductor device 100B of FIG. 5, and the descriptions of the corresponding portions will be appropriately omitted.

Figure 3:
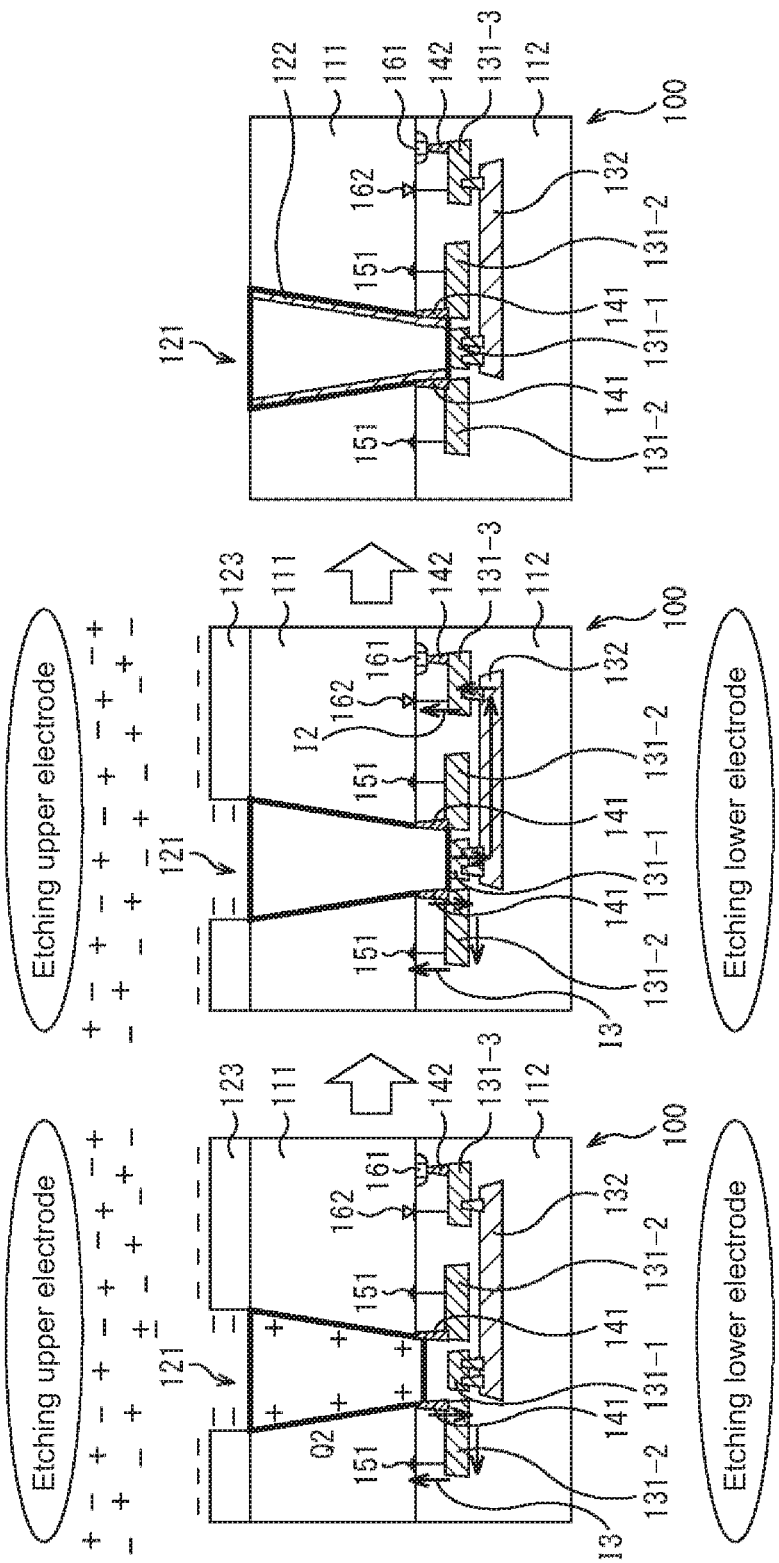
FIGS. 3A, 3B, and 3C are views each describing a PID mechanism obtained when the present technology is applied.

That is, compared with the semiconductor device 100 of FIGS. 3A 3 and 3C, first wiring 131-2 connected to a contact 141 is not connected to ground (GND) 151 to be grounded but is connected to a forward diode 152 of a silicon substrate 111 in the semiconductor device 1008 of FIG. 5.

Here, the forward diode 152 can be, for example, a diode having an N-type substrate or an N-type well and having a P-type surface injection layer. Thus, the contact 141 comes into contact with, for example, the N-type well or a P-type diffusion layer inside the silicon substrate 111.

When the semiconductor device 100B having such a structure is manufactured, etching is performed from the side of the silicon substrate 111 to form a via 121. However, the lateral surface of the via 121 comes into contact with the contact 141 halfway through the etching, whereby charges inside the hole of the via 121 can be reduced.

After that, a part of the bottom surface of the via 121 and first wiring 131-1 come into contact with each other as the etching of the via 121 is advanced, and the charges inside the hole of the via 121 flow into a subsequent-stage circuit (for example, a transistor 161 or the like) via the first wiring 131-1.

At this time, a current flowing into the subsequent-stage circuit via the first wiring 131-1 is also reduced since an electric field inside the via 121 has been already reduced by the contact between the lateral surface of the via 121 and the contact 141. Thus, in the semiconductor device 100B of the second embodiment, the expansion of the protecting function of a protecting diode 162 can be suppressed with a reduction in PID itself.

The semiconductor device 100B of the second embodiment is described above.

4. Third Embodiment

Figure 6:
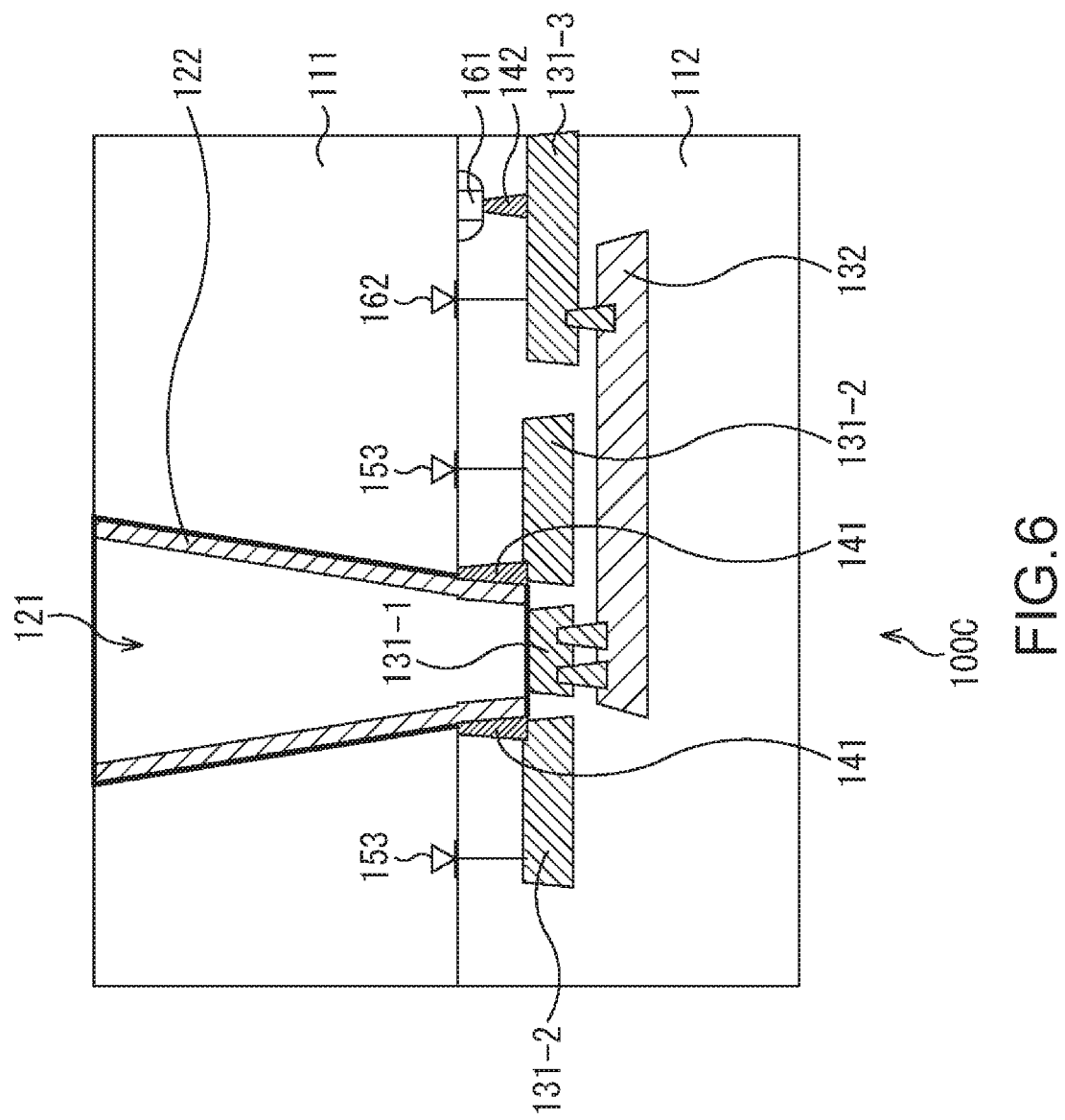
FIG. 6 is a view describing the structure of the semiconductor device of a third embodiment.

FIG. 6 is a view describing the structure of the semiconductor device of a third embodiment.

Note that FIG. 6 shows a cross-sectional view of a part of the structure of a semiconductor device 100C as the third embodiment. However, portions corresponding to those of the semiconductor device 100 of FIGS. 3A 3B, and 3C are denoted by the same symbols in the semiconductor device 100C of FIG. 6, and the descriptions of the corresponding portions will be appropriately omitted.

That is, compared with the semiconductor device 100 of FIGS. 3A, 3B, and 3C, first wiring 131-2 connected to a contact 141 is not connected to ground (GND) 151 to be grounded but is connected to a reverse diode 153 of a silicon substrate 111 in the semiconductor device 100C of FIG. 6.

Here, the reverse diode 153 can be, for example, a diode having a P-type substrate and an N-type surface injection layer. Thus, the contact 141 comes into contact with, for example, a P-type well or an N-type diffusion layer inside the silicon substrate 111.

When the semiconductor device 100C having such a structure is manufactured, etching is performed from the side of the silicon substrate 111 to form a via 121. However, the lateral surface of the via 121 comes into contact with the contact 141 halfway through the etching, whereby charges inside the hole of the via 121 can be reduced.

After that, a part of the bottom surface of the via 121 and first wiring 131-1 come into contact with each other as the etching of the via 121 is advanced, and the charges inside the hole of the via 121 flow into a subsequent-stage circuit (for example, a transistor 161 or the like) via the first wiring 131-1.

At this time, a current flowing into the subsequent-stage circuit via the first wiring 131-1 is also reduced since an electric field inside the via 121 has been already reduced by the contact between the lateral surface of the via 121 and the contact 141. Thus, in the semiconductor device 100C of the third embodiment, the expansion of the protecting function of a protecting diode 162 can be suppressed with a reduction in PID itself.

Further, the first wiring 131-2 is connected to the reverse diode 153 in the semiconductor device 100C of the third embodiment. Therefore, since the semiconductor device 100C has higher diode resistance compared with the semiconductor device 100A (FIG. 4) or the semiconductor device 100B (FIG. 5), an insulating film 122 can be thinned.

The semiconductor device 100C of the third embodiment is described above.

5. Fourth Embodiment

Figure 7:
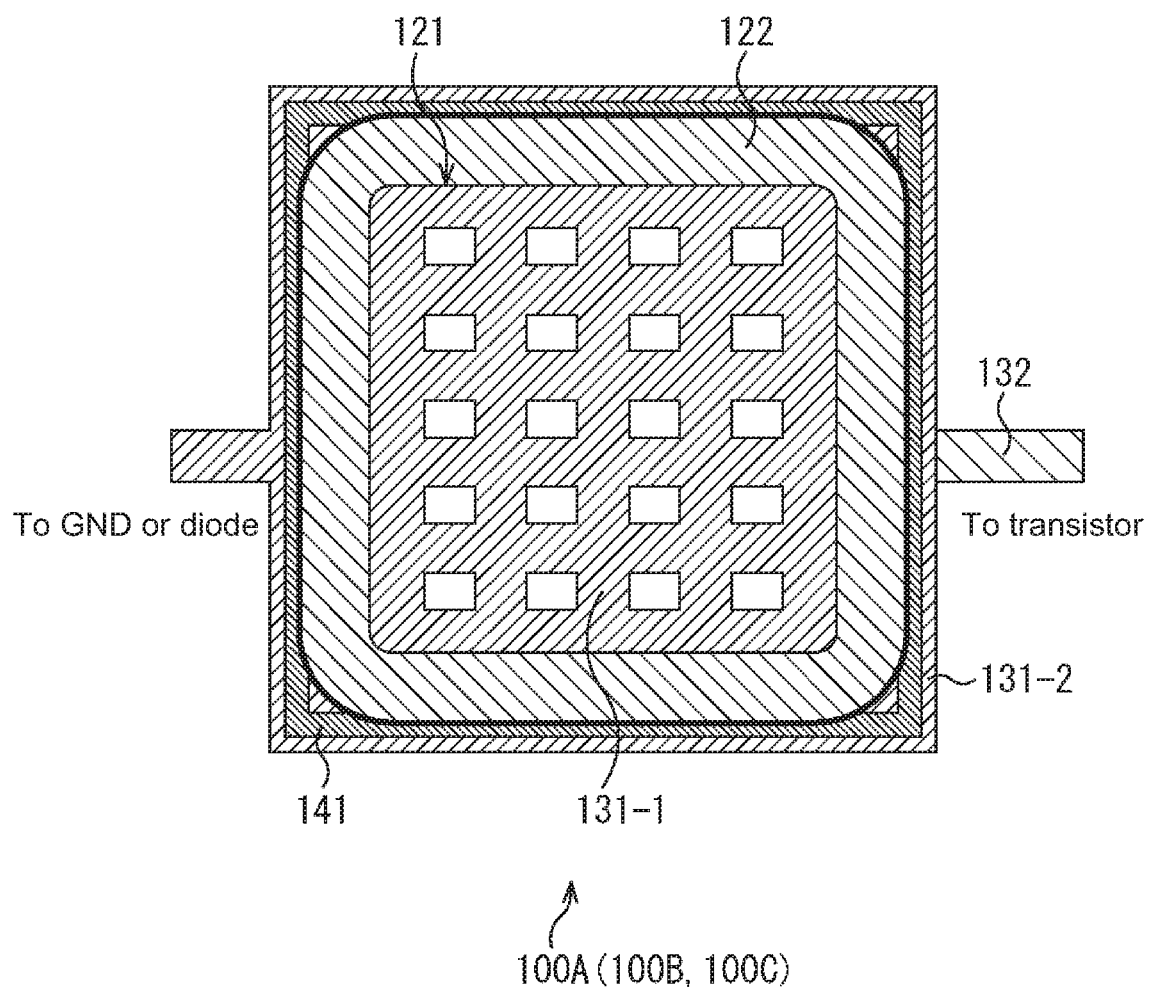
FIG. 7 is a view describing the structure of the semiconductor device of a fourth embodiment.

FIG. 7 is a view describing the structure of the semiconductor device of a fourth embodiment.

Note that FIG. 7 shows, as the fourth embodiment, a top view obtained when the structure of the peripheral region of the via 121 formed in the silicon substrate 111 of the semiconductor device 100A shown in FIG. 4 is seen from the side of the silicon substrate 111.

In the semiconductor device 100A shown in FIG. 7, the contact 141 is formed at a partial region of the lateral surface of the via 121 formed in the silicon substrate 111 and the interlayer film 112 but formed so as to surround (the periphery of) the lateral surface of the via 121. The contact 141 thus formed is connected to the ground 151 via the first wiring 131-2 and grounded to the silicon substrate 111.

Since the area of a region with which the contact 141 comes into contact can be increased with respect to the lateral surface of the via 121 by such a structure in which the contact 141 surrounds (the periphery of) the lateral surface of the via 121 as described above, charges inside the hole of the via 121 can be easily released.

Note that the structure of the semiconductor device 100A shown in FIG. 4 is described as an example in FIG. 7. However, the semiconductor device 100B (FIG. 5) or the semiconductor device 100C (FIG. 6) can also have a structure in which the contact 141 is formed so as to surround (the periphery) of the lateral surface of the via 121.

The semiconductor device 100A (100B, 100C) of the fourth embodiment is described above.

6. Fifth Embodiment

Figure 8:
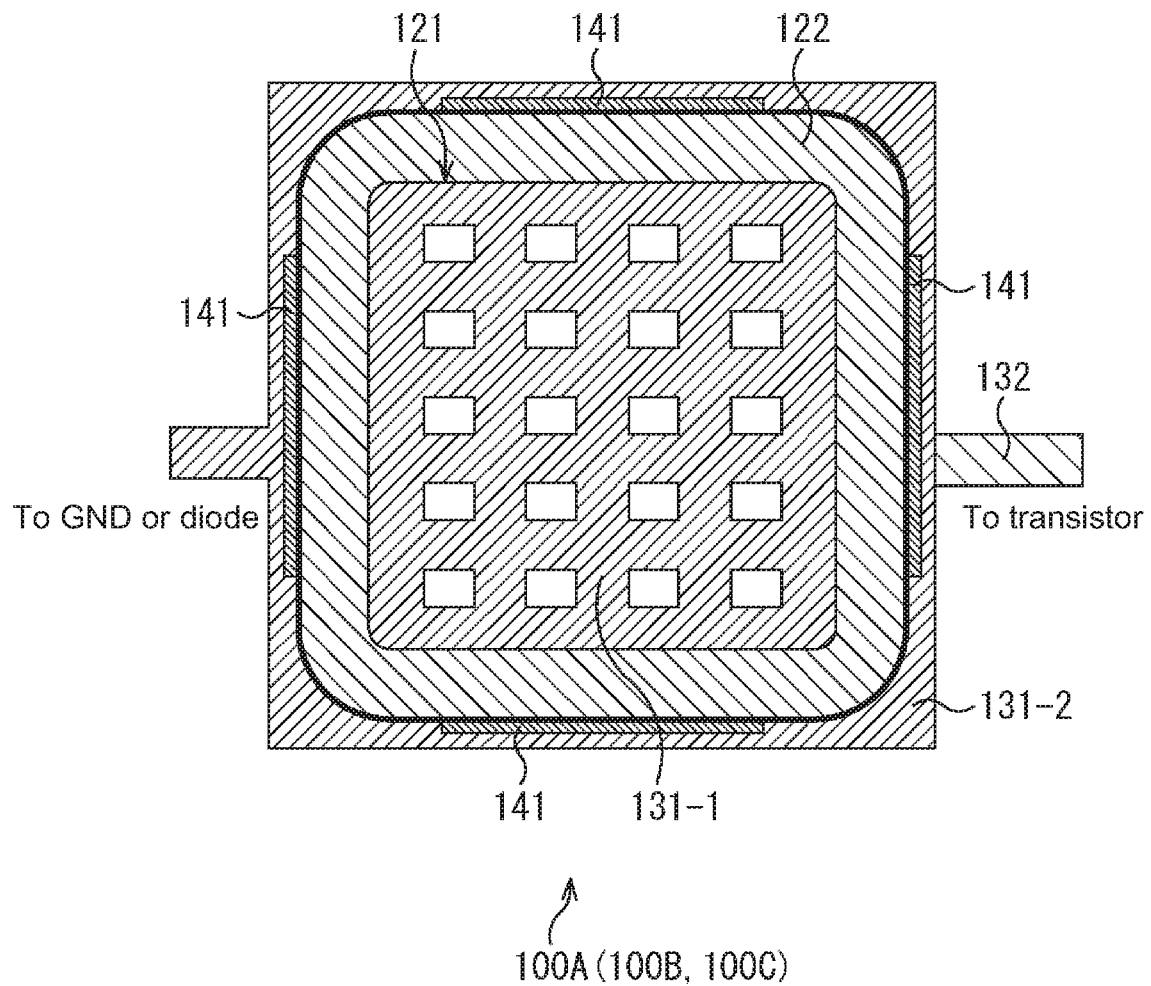
FIG. 8 is a view describing the structure of the semiconductor device of a fifth embodiment.

FIG. 8 is a view describing the structure of the semiconductor device of a fifth embodiment.

Note that FIG. 8 shows, as the fifth embodiment, a top view obtained when the structure of the peripheral region of the via 121 formed in the silicon substrate 111 of the semiconductor device 100A shown in FIG. 4 is seen from the side of the silicon substrate 111.

In the semiconductor device 100A shown in FIG. 8, the contact 141 is formed at a partial region of the lateral surface of the via 121 formed in the silicon substrate 111 and the interlayer film 112 but formed so as to come into contact with a part of the lateral surface of the via 121.

More specifically, the contact 141 is each formed at a partial region of the respective sides (four sides) of the via 121 having a substantially rectangular shape. The contact 141 thus formed is connected to the ground 151 via the first wiring 131-2 and grounded to the silicon substrate 111.

For example, by a structure in which the contact 141 is formed so as to come into contact with a part of the lateral surface of the via 121, the semiconductor device 100A may be easily processed in some cases and thus has an advantage in its processing.

Note that the structure of the semiconductor device 100A shown in FIG. 4 is described as an example in FIG. 8. However, the semiconductor device 100B (FIG. 5) or the semiconductor device 100C (FIG. 6) can also have a structure in which the contact 141 is formed so as to come into contact with a part of the lateral surface of the via 121.

The semiconductor device 100A (100B, 100C) of the fifth embodiment is described above.

7. Sixth Embodiment

Figure 9:
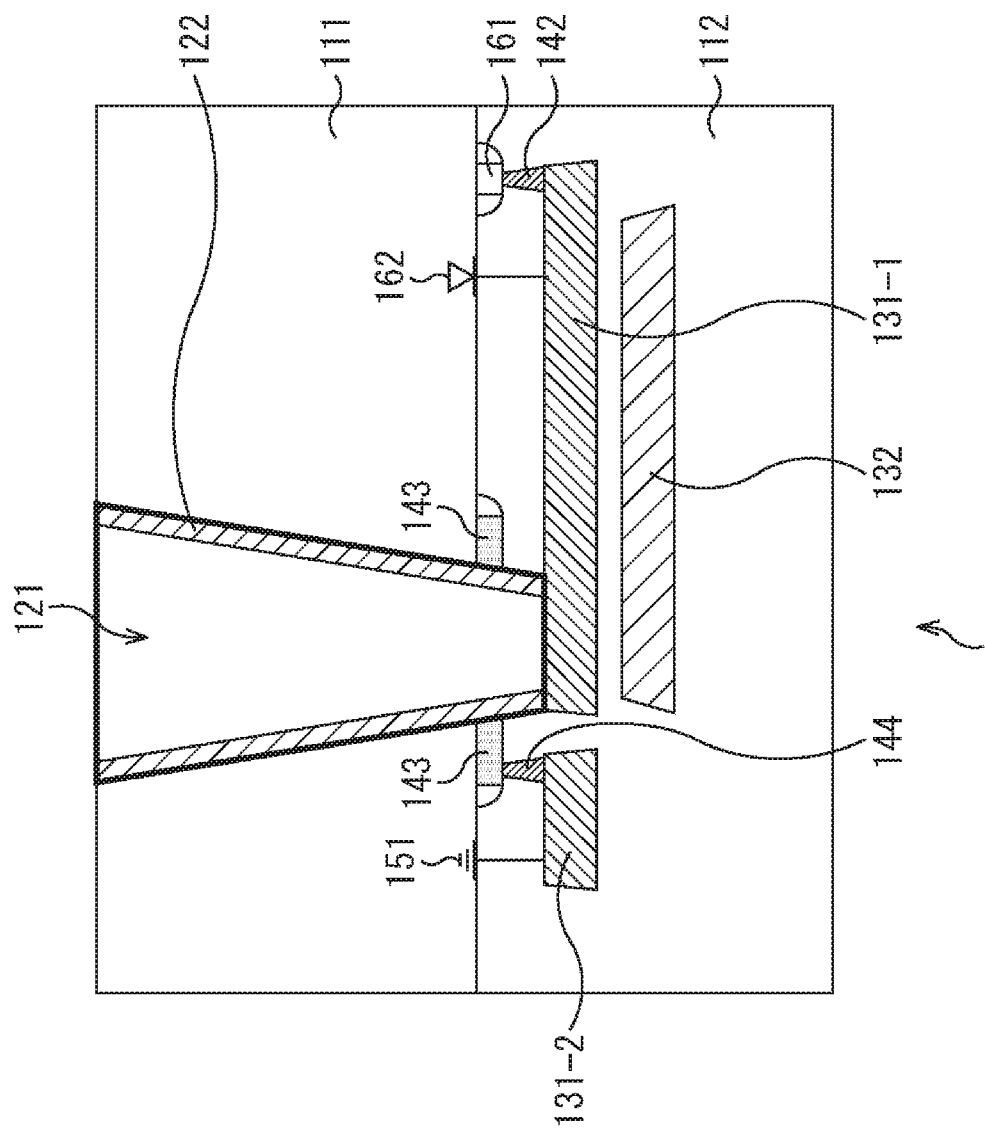
FIG. 9 is a view describing the structure of the semiconductor device of a sixth embodiment.

FIG. 9 is a view describing the structure of the semiconductor device of a sixth embodiment.

Note that FIG. 9 shows a cross-sectional view of a part of the structure of a semiconductor device 100D as the sixth embodiment. However, portions corresponding to those of the semiconductor device 100 of FIGS. 3A 3B, and 3C are denoted by the same symbols in the semiconductor device 100D of FIG. 9, and the descriptions of the corresponding portions will be appropriately omitted.

That is, compared with the semiconductor device 100 of FIGS. 3A, 3B, and 3C, a gate electrode 143 is formed instead of a contact 141 and connected to first wiring 131-2 via a contact 144.

Highly-doped polycrystalline silicon (Poly Si) is, for example, used as the gate electrode 143, and an impurity such as boric acid (B), phosphor (P), and arsenic (As) is highly doped and made into low resistance. Further, the gate electrode 143 is connected to ground 151 via the first wiring 131-2 connected to the contact 144 and grounded to a silicon substrate 111. The grounding method is realized in such a manner that the gate electrode 143 comes into contact with, for example, P+/Well or N+/Nwell.

Here, when the semiconductor device 100D is manufactured, etching is performed from the side of the silicon substrate 111 to form a via 121. However, halfway through the etching, the lateral surface of the via 121 comes into contact with the gate electrode 143, and some of charges accumulated inside the hole of the via 121 flows to the side of the silicon substrate 111 via the gate electrode 143, the contact 144, and the first wiring 131-2. Thus, the charges inside the hole of the via 121 can be reduced.

After that, a part of the bottom surface of the via 121 and the first wiring 131-1 come into contact with each other as the etching of the via 121 is advanced, and the charges inside the hole of the via 121 flow into a subsequent-stage circuit (for example, a transistor 161 or the like) via the first wiring 131-1.

At this time, a current flowing into the subsequent-stage circuit via the first wiring 131-1 is also reduced since an electric field has been already reduced by the contact between the lateral surface of the via 121 and the gate electrode 143. Thus, in the semiconductor device 100D of the sixth embodiment, the expansion of the protecting function of a protecting diode 162 can be suppressed with a reduction in PID itself.

Note that a structure in which the gate electrode 143 is connected to the ground 151 via the first wiring 131-2 connected to the contact 144 and grounded to the silicon substrate 111 is described as an example in FIG. 9. However, the gate electrode 143 may be connected to a forward diode 152 or a reverse diode 153 rather than being connected to the ground 151.

The semiconductor device 100D of the sixth embodiment is described above.

8. Seventh Embodiment

Figure 10:
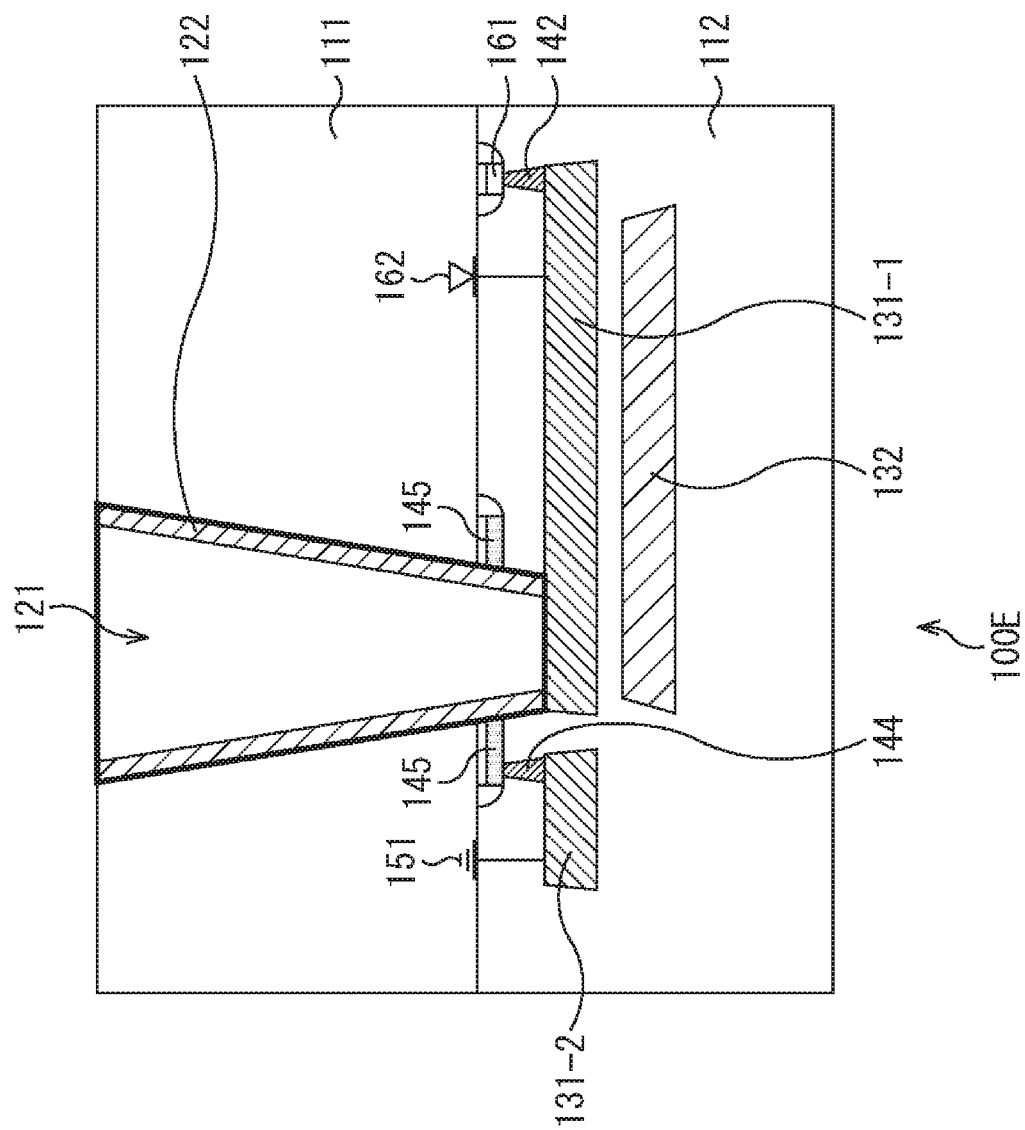
FIG. 10 is a view describing the structure of the semiconductor device of a seventh embodiment.

FIG. 10 is a view describing the structure of the semiconductor device of a seventh embodiment.

Note that FIG. 10 shows a cross-sectional view of a part of the structure of a semiconductor device 100E as the seventh embodiment. However, portions corresponding to those of the semiconductor device 100D of FIG. 9 are denoted by the same symbols in the semiconductor device 100E of FIG. 10, and the descriptions of the corresponding portions will be appropriately omitted.

That is, compared with the semiconductor device 100D of FIG. 9, a gate electrode 145 is formed in the semiconductor device 100E of FIG. 10 instead of a gate electrode 143.

The gate electrode 145 is made of, for example, a metal electrode material such as titanium nitride (TiN) and nickel silicon (NiSi) and formed to include a low resistance layer. By the gate electrode 145 having such a structure, charges accumulated inside the hole of a via 121 can be easily released to a silicon substrate 111.

Further, the gate electrode 145 is connected to ground 151 via first wiring 131-2 connected to a contact 144 and grounded to a silicon substrate 111. The grounding method is realized in such a manner that the gate electrode 145 comes into contact with, for example, P+/Well or N+/Nwell.

Here, when the semiconductor device 100E is manufactured, etching is performed from the side of the silicon substrate 111 to form the via 121. However, halfway through the etching, the lateral surface of the via 121 comes into contact with the gate electrode 143, and some of charges accumulated inside the hole of the via 121 flows to the side of the silicon substrate 111 via the gate electrode 145, the contact 144, and the first wiring 131-2. Thus, the charges inside the hole of the via 121 can be reduced.

After that, a part of the bottom surface of the via 121 and the first wiring 131-1 come into contact with each other as the etching of the via 121 is advanced, and the charges inside the hole of the via 121 flow into a subsequent-stage circuit (for example, a transistor 161 or the like) via the first wiring 131-1.

At this time, a current flowing into the subsequent-stage circuit via the first wiring 131-1 is also reduced since an electric field has been already reduced by the contact between the lateral surface of the via 121 and the gate electrode 145. Thus, in the semiconductor device 100E of the seventh embodiment, the expansion of the protecting function of a protecting diode 162 can be suppressed with a reduction in PID itself.

Note that a structure in which the gate electrode 145 is connected to the ground 151 via the first wiring 131-2 connected to the contact 144 and grounded to the silicon substrate 111 is described as an example in FIG. 10. However, the gate electrode 145 may be connected to a forward diode 152 or a reverse diode 153 rather than being connected to the ground 151.

The semiconductor device 100E of the seventh embodiment is described above.

9. Eighth Embodiment

Figure 11:
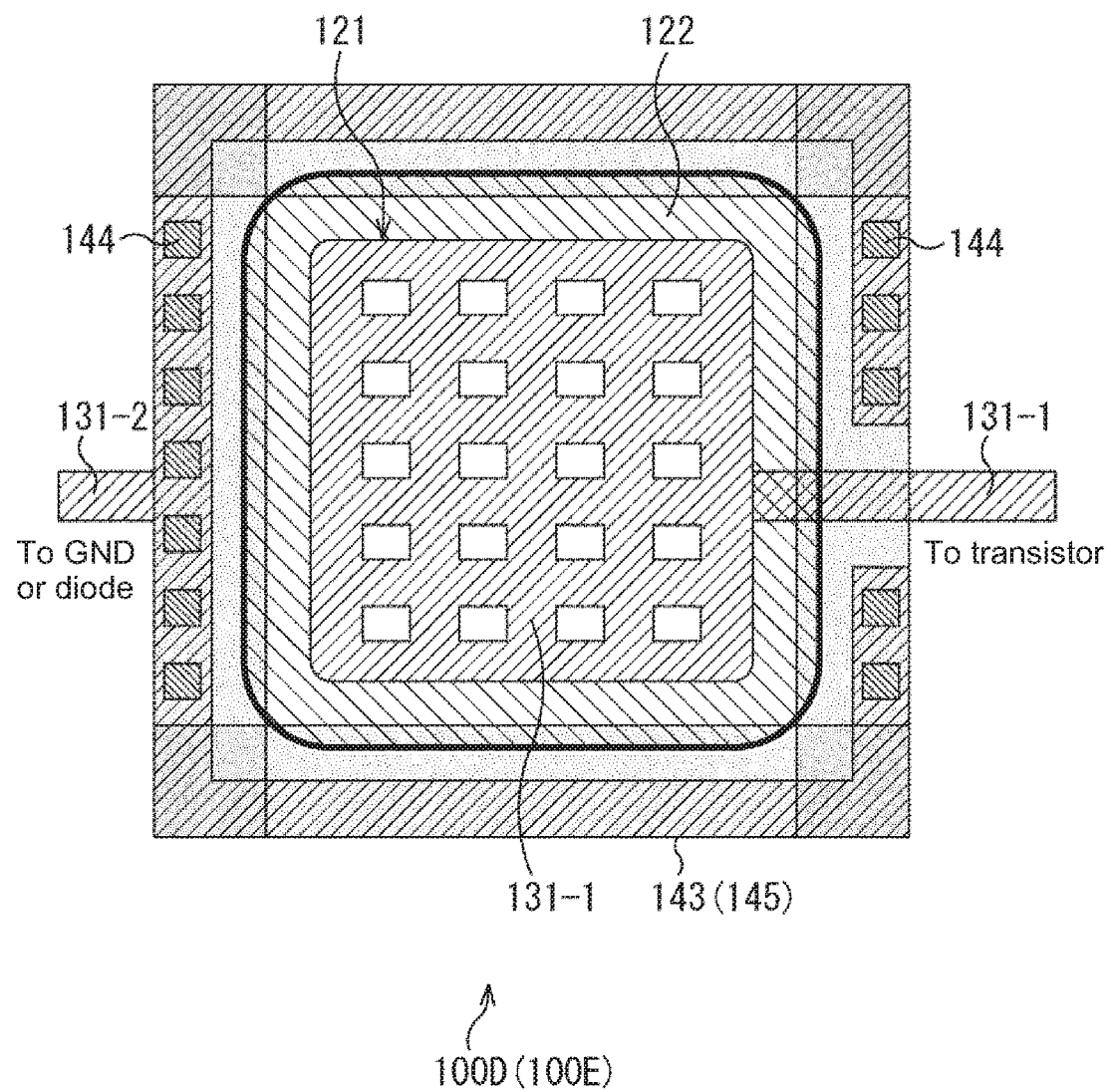
FIG. 11 is a view describing the structure of the semiconductor device of an eighth embodiment.

FIG. 11 is a view describing the structure of the semiconductor device of an eighth embodiment.

Note that FIG. 11 shows, as the eighth embodiment, a top view obtained when the structure of the peripheral region of the via 121 formed in the silicon substrate 111 of the semiconductor device 100D shown in FIG. 9 is seen from the side of the silicon substrate 111.

In the semiconductor device 100D shown in FIG. 11, the gate electrode 143 is formed at a partial region of the lateral surface of the via 121 formed in the silicon substrate 111 and the interlayer film 112 but formed so as to surround (the periphery) of the lateral surface of the via 121. The gate electrode 143 thus formed is connected to the ground 151 via the first wiring 131-2 connected to the contact 144 and grounded to the silicon substrate 111.

Since the area of a region with which the gate 143 comes into contact can be increased with respect to the lateral surface of the via 121 by such a structure in which the gate electrode 143 surrounds (the periphery of) the lateral surface of the via 121 as described above, charges inside the hole of the via 121 can be easily released.

Note that the structure of the semiconductor device 100D shown in FIG. 9 is described as an example in FIG. 11. However, the semiconductor device 100E (FIG. 10) can also have a structure in which the gate electrode 145 is formed so as to surround (the periphery) of the lateral surface of the via 121.

The semiconductor device 100D (100E) of the eighth embodiment is described above.

10. Ninth Embodiment

Figure 12:
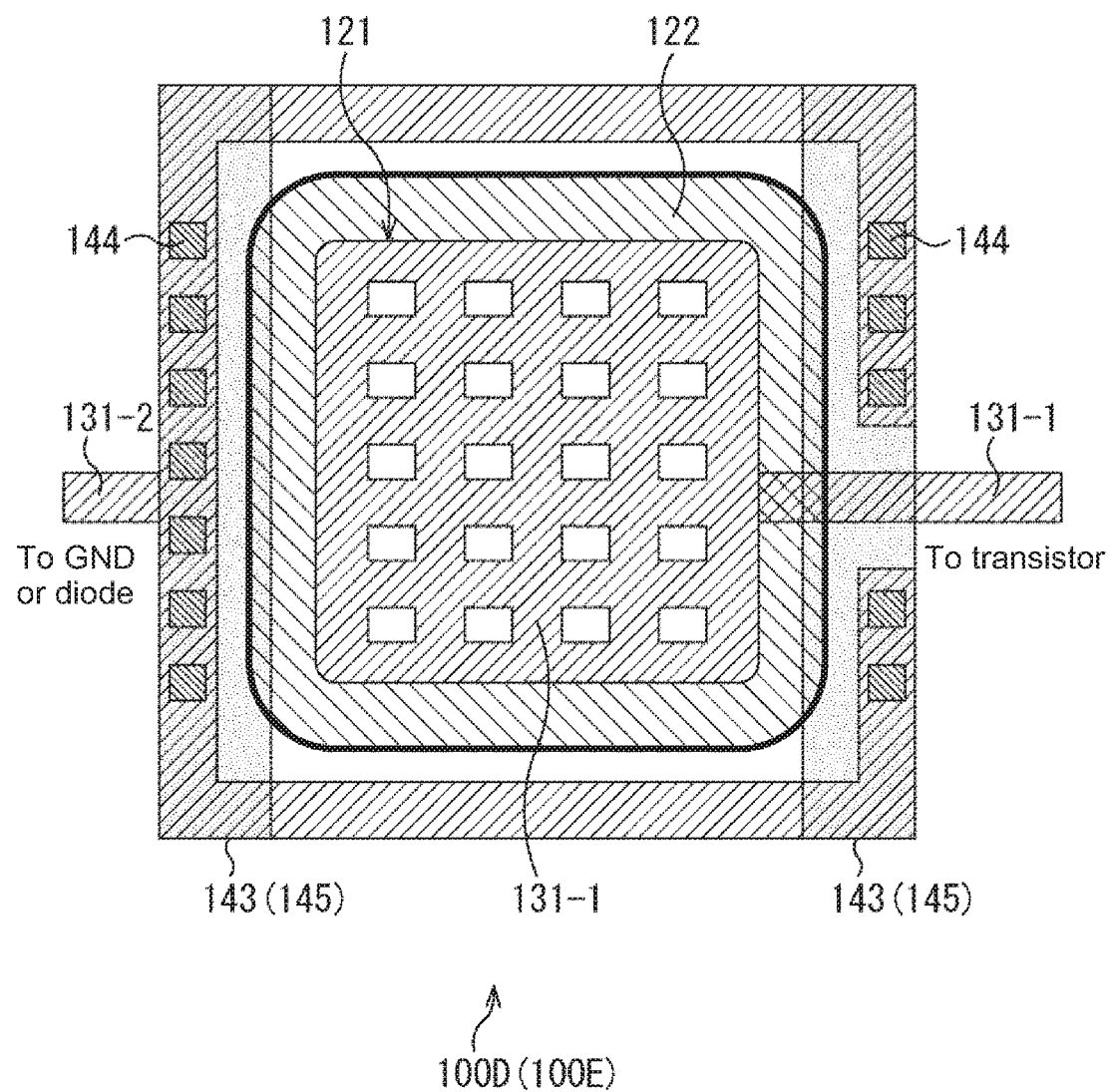
FIG. 12 is a view describing the structure of the semiconductor device of a ninth embodiment.

FIG. 12 is a view describing the structure of the semiconductor device of a ninth embodiment.

Note that FIG. 12 shows, as the ninth embodiment, a top view obtained when the structure of the peripheral region of the via 121 formed in the silicon substrate 111 of the semiconductor device 100D shown in FIG. 9 is seen from the side of the silicon substrate 111.

In the semiconductor device 100D shown in FIG. 12, the gate electrode 143 is formed at a partial region of the lateral surface of the via 121 formed in the silicon substrate 111 and the interlayer film 112 but formed so as to come into contact with the lateral surface of the via 121.

More specifically, the gate electrode 143 is each formed at a part of the right and left sides of the respective sides (four sides) of the via 121 having a substantially rectangular shape. The gate electrode 143 thus formed is connected to the ground 151 via the first wiring 131-2 connected to the contact 144 and grounded to the silicon substrate 111.

For example, by a structure in which the gate electrode 143 is formed so as to come into contact with a part of the lateral surface of the via 121, the semiconductor device 100D may be easily processed in some cases and thus has an advantage in its processing.

Note that the structure of the semiconductor device 100D shown in FIG. 9 is described as an example in FIG. 12. However, the semiconductor device 100E (FIG. 10) can also have a structure in which the gate electrode 145 is formed so as to come into contact with a part of the lateral surface of the via 121.

The semiconductor device 100D (100E) of the ninth embodiment is described above.

11. Tenth Embodiment

FIG. 13 is a view describing the structure of the semiconductor device of a tenth embodiment.

Note that FIG. 13 shows a cross-sectional view of a part of the structure of a semiconductor device 100F as the tenth embodiment. However, portions corresponding to those of the semiconductor device 100 of FIGS. 3A 3B, and 3C are denoted by the same symbols in the semiconductor device 100F of FIG. 13, and the descriptions of the corresponding portions will be appropriately omitted.

That is, compared with the semiconductor device 100 of FIGS. 3A, 3B, and 3C, first wiring 131-1 is removed in the region of the bottom surface of a via 121 and the bottom surface of the via 121 comes into contact with second wiring 132 in the semiconductor device 100F of FIG. 13. Further, in the semiconductor device 100F of FIG. 13, a contact 141 is removed, and first wiring 131-2 is formed so as to come into contact with a partial region of the lateral surface of the via 121. However, the first wiring 131-2 is electrically separated from other conductive members by an insulating film 122.

The first wiring 131-2 is connected to ground 151 and grounded to a silicon substrate 111. The grounding method is realized in such a manner that the first wiring 131-1 comes into contact with, for example, P+/Well or N+/Nwell.

Figure 14A:
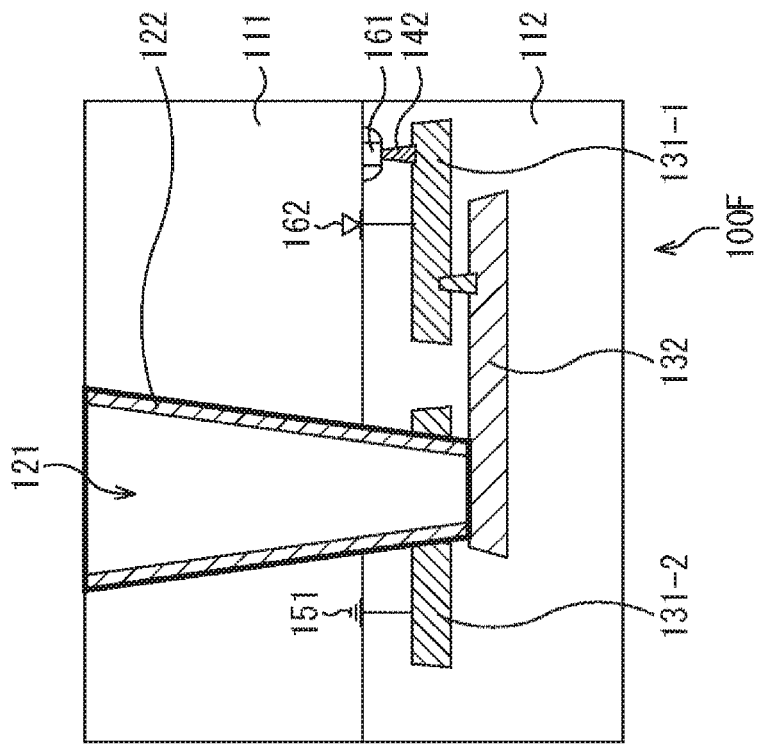
FIGS. 14A and 14B are views each describing a method for manufacturing the semiconductor device of the tenth embodiment.

Here, the state of the manufacturing of the semiconductor device 100F of the tenth embodiment will be described with reference to FIGS. 14A and 14B.

First, in an etching process, etching is performed from the side of the silicon substrate 111. Thus, as shown in FIG. 14A, the lateral surface of the via 121 first comes into contact with the first wiring 131-2, and then the bottom surface of the via 121 reaches and comes into contact with the second wiring 132 as the etching is advanced.

At this time, some of charges accumulated inside the hole of the via 121 flows to the side of the silicon substrate 111 via the first wiring 131-2. Thus, the charges inside the hole of the via 121 can be reduced as described above.

After that, a part of the bottom surface of the via 121 and the second wiring 132 come into contact with each other as the etching of the via 121 is advanced, and the charges inside the hole of the via 121 flow into a subsequent-stage circuit (for example, a transistor 161 or the like) via the second wiring 132.

At this time, a current flowing into the subsequent-stage circuit via the second wiring 132 is also reduced since an electric field inside the via 121 has been already reduced by the contact between the lateral surface of the via 121 and the first wiring 131-2. Thus, in the semiconductor device 100F of the tenth embodiment, the expansion of the protecting function of a protecting diode 162 can be suppressed with a reduction in PID itself.

Figure 14B:
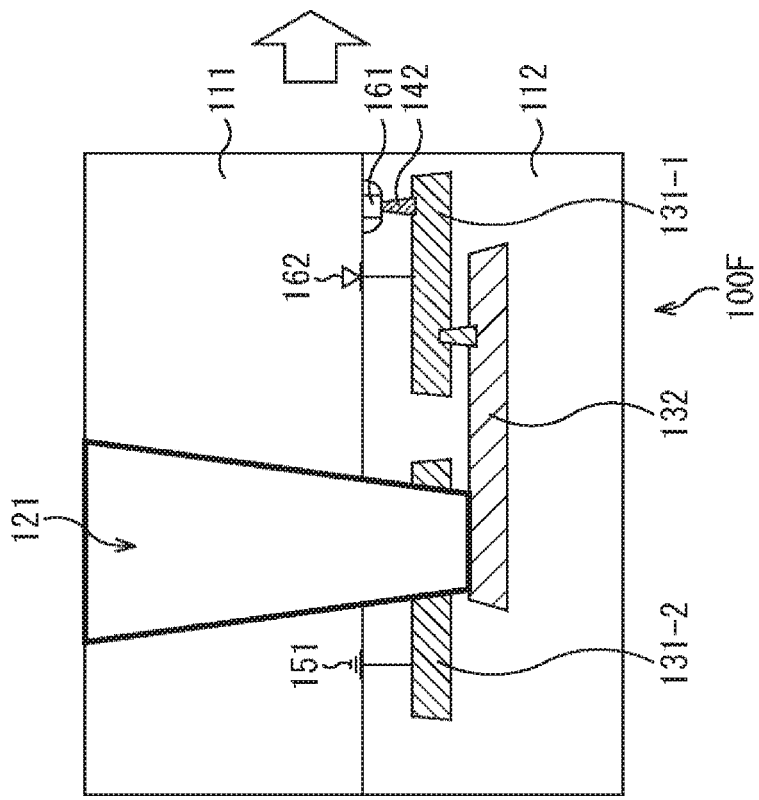

Next, when the etching process is finished, an insulating film forming process is performed as shown in FIG. 14B, whereby the lateral surface of the via 121 is covered with an insulating film 122 such as a silicon nitride film (SiN). Then, the insulating film 122 of the bottom surface of the via 121 is etched back so as to make only the insulating film 122 of the lateral surface of the via 121 remain.

Thus, the lateral surface of the via 121 is protected by the insulating film 122, and the first wiring 131-2 is electrically separated from other conductive members. Further, a conductive member such as copper (Cu) is embedded in the via 121 in a subsequent process.

Further, in the semiconductor device 100F of the tenth embodiment, the electric field inside the via 121 can be reduced by the contact between the via 121 and the first wiring 131-2 having lower resistance than the contact 141.

Note that a structure in which the first wiring 131-2 is connected to the ground 151 and grounded to the silicon substrate 111 is described as an example in FIG. 13. However, the first wiring 131-2 may be connected to a forward diode 152 or a reverse diode 153 rather than being connected to the ground 151.

The semiconductor device 100F of the tenth embodiment is described above.

12. Eleventh Embodiment

FIG. 15 is a view describing the structure of the semiconductor device of an eleventh embodiment.

Note that FIG. 15 shows a cross-sectional view of a part of the structure of a semiconductor device 100G as the eleventh embodiment. However, portions corresponding to those of the semiconductor device 100F of FIG. 13 are denoted by the same symbols in the semiconductor device 100G of FIG. 15, and the descriptions of the corresponding portions will be appropriately omitted.

That is, the semiconductor device 100G of FIG. 15 is the same as the semiconductor device 100F of FIG. 13 in that first wiring 131-2 is formed so as to come into contact with a partial region of the lateral surface of a via 121 but is different in that the contact part of the partial region is not covered with an insulating film 122. Further, the first wiring 131-2 is connected to a reverse diode 153 of a silicon substrate 111.

Here, the state of the manufacturing of the semiconductor device 100G of the eleventh embodiment will be described with reference to FIGS. 16A, 16B, and 16C.

First, in a first etching process, etching is performed to form the via 121. Here, the bottom surface of the via 121 is stopped in an interlayer film 112 between the silicon substrate 111 and the first wiring 131-2 (FIG. 16A). Then, when the first etching process is finished, an insulating film forming process is performed as shown in FIG. 16A, whereby the inside of the via 121 is covered with an insulating film 122 such as a silicon nitride film (SiN).

Next, in an insulating film etching-back process, the insulating film 122 of the bottom surface of the via 121 is etched back so as to make only the insulating film 122 of the lateral surface of the via 121 remain as shown in FIG. 16B.

Then, in a second etching process, etching is performed again on the via 121. Here, as shown in FIG. 16C, the lateral surface of the via 121 first comes into contact with the first wiring 131-2, and then the bottom surface of the via 121 reaches and comes into contact with the second wiring 132 as the etching is advanced.

At this time, charges accumulated inside the hole of the via 121 can be released to the silicon substrate 111 via the reverse diode 153 from the first wiring 131-2. Thus, the charges accumulated inside the hole of the via 121 can be reduced as described above.

Further, a current flowing into a subsequent-stage circuit via the second wiring 132 is also reduced since an electric field inside the via 121 has been already reduced by the contact between the lateral surface of the via 121 and the first wiring 131-2 when the bottom surface of the via 121 comes into contact with the second wiring 132. Thus, in the semiconductor device 100G of the eleventh embodiment, the expansion of the protecting function of a protecting diode 162 can be suppressed with a reduction in PID itself.

Further, a conductive member such as copper (Cu) is embedded in the via 121 in a subsequent process. On this occasion, the first wiring 131-2 and the via 121 are connected to each other by the conductive member. However, since the first wiring 131-2 is connected to the silicon substrate 111 by the reverse diode 153, a leak current is prevented from flowing to the silicon substrate 111 at a voltage less than or equal to a diode withstand voltage during the operation of the circuit.

Note that during the manufacturing of the semiconductor device 100G, an insulating film etching-back process is not required to be performed after the bottom surface of the via 121 comes into contact with the second wiring in the second etching process and the bottom surface of the via 121 is free from the damage of the insulating film etching back as shown in FIG. 16C. Therefore, damage on the circuit due to the occurrence of plasma can be reduced. Further, the structure of the semiconductor device 100G has an advantage in that the influence of PID on the lower lateral surface of the lateral surface of the via 121 that has been processed in the second etching process can be suppressed.

The semiconductor device 100G of the eleventh embodiment is described above.

13. Twelfth Embodiment

Figure 17:
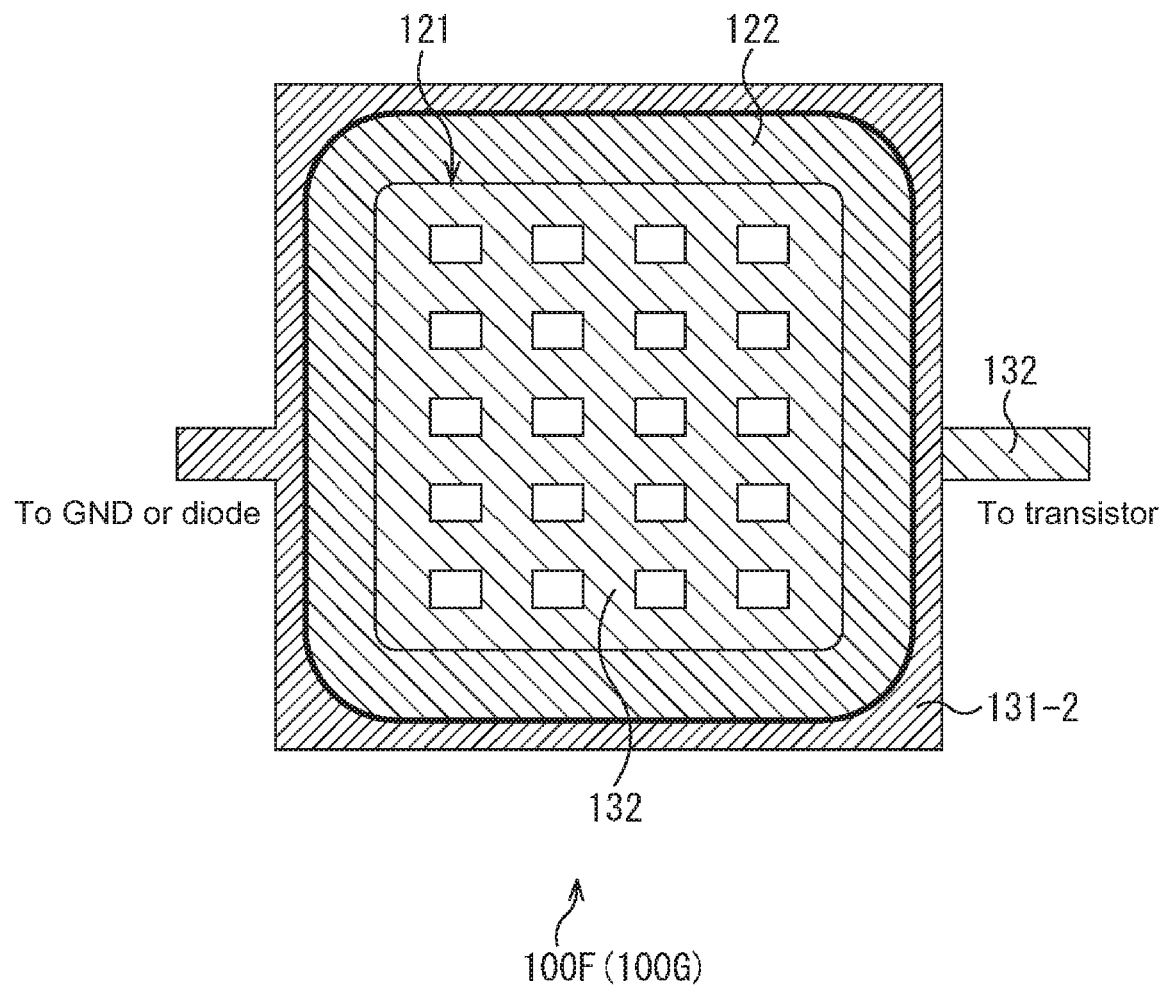
FIG. 17 is a view describing the structure of the semiconductor device of a twelfth embodiment.

FIG. 17 is a view describing the structure of the semiconductor device of a twelfth embodiment.

Note that FIG. 17 shows, as the twelfth embodiment, a top view obtained when the structure of the peripheral region of the via 121 formed in the silicon substrate 111 of the semiconductor device 100F shown in FIG. 13 is seen from the side of the silicon substrate 111.

In the semiconductor device 100F shown in FIG. 17, the first wiring 131-2 is formed at a partial region of the lateral surface of the via 121 formed in the silicon substrate 111 but formed so as to surround (the periphery) of the lateral surface of the via 121. The first wiring 131-2 thus formed is connected to the ground 151 and grounded to the silicon substrate 111.

Note that the structure of the semiconductor device 100F shown in FIG. 13 is described as an example in FIG. 17. However, the semiconductor device 100G (FIG. 15) can also have such a structure in which the first wiring 131-2 is formed so as to surround (the periphery) of the lateral surface of the via 121. However, the semiconductor device 100G uses the reverse diode 153 as a protecting element.

The semiconductor device 100F (100G) of the twelfth embodiment is described above.

14. Thirteenth Embodiment

Figure 18:
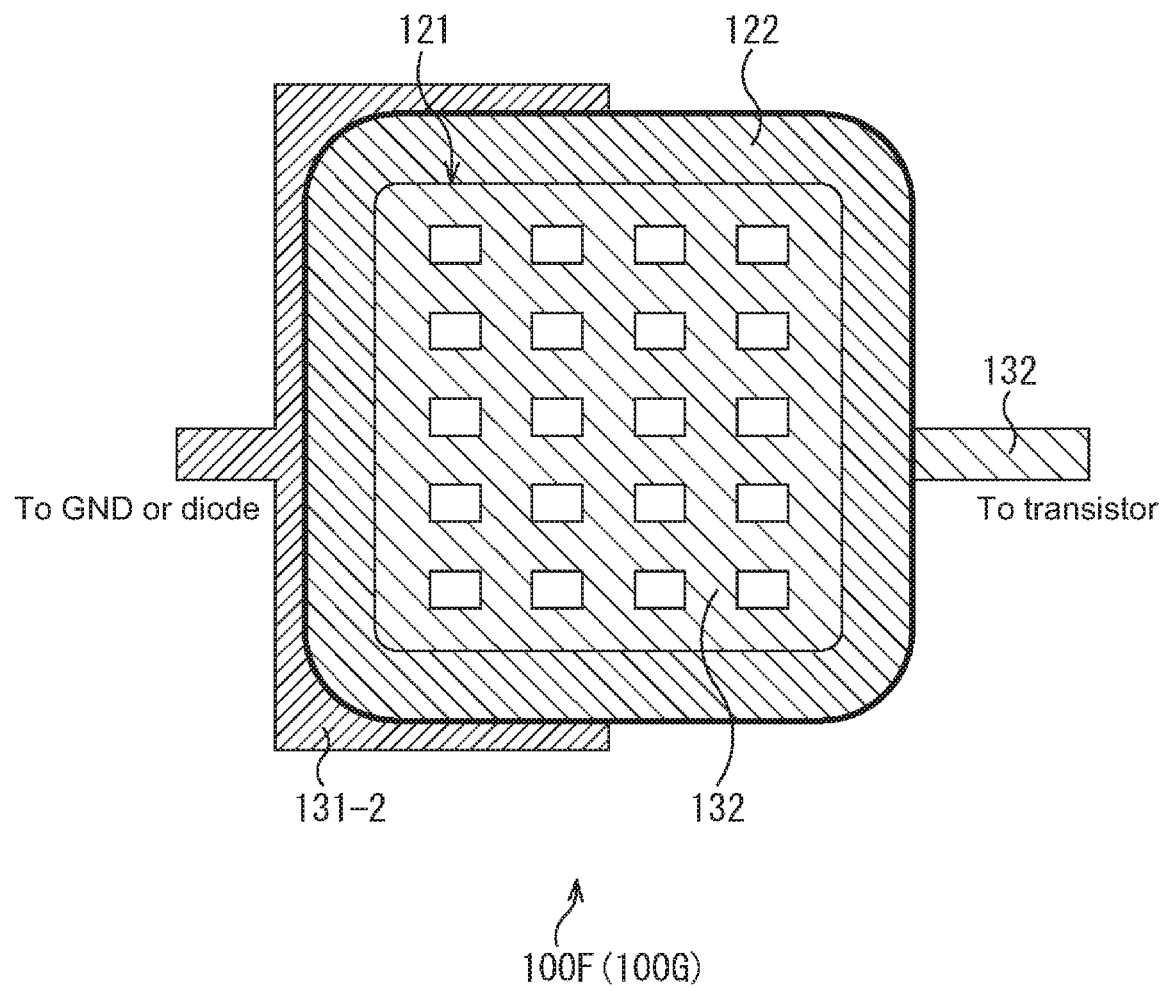
FIG. 18 is a view describing the structure of the semiconductor device of a thirteenth embodiment.

FIG. 18 is a view describing the structure of the semiconductor device of a thirteenth embodiment.

Note that FIG. 18 shows, as the thirteenth embodiment, a top view obtained when the structure of the peripheral region of the via 121 formed in the silicon substrate 111 of the semiconductor device 100F shown in FIG. 13 is seen from the side of the silicon substrate 111.

In the semiconductor device 100F shown in FIG. 18, the first wiring 131-2 is formed at a partial region of the lateral surface of the via 121 formed in the silicon substrate 111 but formed so as to come into contact with a part of the lateral surface of the via 121.

More specifically, the first wiring 131-2 is formed only (on the periphery of) the left lateral surface region of the lateral surface regions of the via 121 having a substantially rectangular shape. The first wiring 131-2 thus formed is connected to the ground 151 and grounded to the silicon substrate 111.

Note that the structure of the semiconductor device 100F is described as an example in FIG. 18. However, the semiconductor device 100G (FIG. 15) can also have a structure in which the first wiring 131-2 is formed so as to come into contact with a part of the lateral surface of the via 121. However, the semiconductor device 100G uses the reverse diode 153 as a protecting element.

The semiconductor device 100F (100G) of the thirteenth embodiment is described above.

15. Modified Examples

In the above descriptions, the via 121 is illustrated as a groove part formed between the silicon substrate 111 and the interlayer film 112 laminated with each other in the semiconductor device 100. However, the groove part is not limited to the via 121 and includes, for example, an opening part formed in the pad part of the semiconductor device 100, or the like.

Further, in the above descriptions, the contact 141, the gate electrode 143 or the gate electrode 145, or the first wiring 131-2 is illustrated by an example as a conductive member (conductive layer) that comes into contact with the lateral surface (lateral wall) of the via 121. However, the conductive member is not limited to such members and may include other conductive members (conductive layers). Further, the conductive member may not necessarily come into contact with the lateral surface (lateral wall) of the via 121 and may come into contact with the bottom surface (bottom part) of the via 121.

Further, in the above descriptions, the ground 151, the forward diode 152, or the reverse diode 153 is illustrated by an example as a protecting element connected to the contact 141, the gate electrode 143 or the gate electrode 145, or the first wiring 131-2. However, the protecting element is not limited to such diodes and may include, for example, other protecting elements such as protecting transistors.

Note that the semiconductor device 100 includes general semiconductor devices. However, the present technology is applicable to, for example, solid-state imaging devices such as CMOS (Complementary Metal Oxide Semiconductor) image sensors serving as semiconductor devices.

Further, the embodiments of the present technology are not limited to the above embodiments but may be modified in various ways without departing from the spirit of the present technology.

Further, the present technology can employ the following configurations.

(1) A semiconductor device including:
a first layer;
a second layer laminated with the first layer;
a conductive member that comes into contact with a lateral surface of a groove part formed in the first layer and the second layer; and
first wiring that is formed in the second layer and comes into contact with a bottom surface of the groove part, in which
the conductive member is connected to a protecting element for discharging charges accumulated inside the groove part.

(2) The semiconductor device according to (1), in which
the first layer is a semiconductor layer, and
the groove part is a via penetrating the semiconductor layer.

(3) The semiconductor device according to (2), in which
the conductive member is a contact, a gate electrode, or second wiring.

(4) The semiconductor device according to (2) or (3), in which
the protecting element is grounded to the semiconductor layer or is a diode.

(5) The semiconductor device according to any of (2) to (4), in which
the conductive member and the first wiring are electrically separated from each other.

(6) The semiconductor device according to any of (2) to (5), in which
the conductive member comes into contact with the lateral surface of the via at a position closer to a processing surface than a position at which the first wiring comes into contact with the bottom surface of the via.

(7) The semiconductor device according to any of (2) to (6), in which
the conductive member is formed so as to surround a periphery of the lateral surface of the via or formed so as to come into contact with a part of the lateral surface of the via.

(8) The semiconductor device according to any of (2) to (7), in which
the lateral surface of the via is covered with an insulating film and covers the conductive member.

(9) The semiconductor device according to any of (2) to (8), in which
the conductive member is connected to a forward diode serving as the protecting element, and
the forward diode is a diode having an N-type substrate or an N-type well and having a P-type surface injection layer.

(10) The semiconductor device according to any of (2) to (8), in which
the conductive member is connected to a reverse diode serving as the protecting element, and
the reverse diode is a diode having a P-type substrate and an N-type surface injection layer.

(11) The semiconductor device according to any of (2) to (8), in which
the conductive member is the gate electrode, and
the gate electrode at least partially includes an injection layer made of a prescribed injection ion species or a metal layer made of a prescribed metal material.

(12) The semiconductor device according to any of (2) to (8), in which
the conductive member is the second wiring,
the conductive member is connected to a reverse diode serving as the protecting element,
the reverse diode is a diode having a P-type substrate and an N-type surface injection layer, and
the insulating film covers a region excluding at least a region of the second wiring of the lateral surface of the via.

(13) The semiconductor device according to any of (1) to (12), in which
the first layer is a silicon substrate,
the second layer is an interlayer film, and
the first wiring formed in the interlayer film is connected to a circuit including a transistor and a protecting element that protects the transistor.

(14) A method for manufacturing a semiconductor device, including:
laminating a first layer and a second layer with each other;
forming a conductive member on the second layer so as to come into contact with a lateral surface of a groove part formed in the first layer and the second layer;
forming a protecting element for discharging charges accumulated inside the groove part so as to be connected to the conductive member;
forming first wiring in the second layer so as to come into contact with a bottom surface of the groove part; and
performing etching on the first layer and the second layer laminated with each other from a side of the first layer to form the groove part.

(15) The method for manufacturing a semiconductor device according to (14), in which
the first layer is a semiconductor layer, and
the groove part is a via penetrating the semiconductor layer.

(16) The method for manufacturing a semiconductor device according to (15), in which
the conductive member is a contact, a gate electrode, or second wiring.

(17) The method for manufacturing a semiconductor device according to (15) or (16), in which
the protecting element is grounded to the semiconductor layer or is a diode.

(18) The method for manufacturing a semiconductor device according to any of (15) to (17), in which
the conductive member and the first wiring are electrically separated from each other.

(19) The method for manufacturing a semiconductor device according to any of (15) to (18), in which,
when performing the etching, the conductive member comes into contact with the lateral surface of the via at a position closer to a processing surface on a side of the semiconductor layer than a position at which the first wiring comes into contact with the bottom surface of the via.

(20) The method for manufacturing a semiconductor device according to any of (14) to (19), in which
the first layer is a silicon substrate,
the second layer is an interlayer film, and
the first wiring formed in the interlayer film is connected to a circuit including a transistor and a protecting element that protects the transistor.

REFERENCE SIGNS LIST 100, 100A to 100G semiconductor device
111 silicon substrate
112 interlayer film
121 via
122 insulating film
131-1, 131-2, 131-3 first wiring
132 second wiring
141, 142 contact
143, 145 gate electrode
144 contact
151 ground (GND)
152 forward diode
153 reverse diode
161 transistor
162 protecting diode

The invention claimed is:

1. A semiconductor device, comprising:
a first layer;
a second layer laminated with the first layer;
a groove part in the first layer and the second layer, wherein the groove part is configured to accumulate charges inside the groove part;
a conductive member outside the groove part, wherein the conductive member is in contact with a lateral surface of the groove part;
first wiring in the second layer, wherein the first wiring is in contact with a bottommost surface of the groove part;
second wiring in the second layer, wherein the second wiring is below the bottommost surface of the groove part; and
a first protecting element connected to the conductive member via the second wiring, wherein the first protecting element is configured to discharge the charges accumulated inside the groove part.

2. The semiconductor device according to claim 1, wherein
the first layer is a semiconductor layer, and
the groove part is a via that penetrates the semiconductor layer.

3. The semiconductor device according to claim 2, wherein
the conductive member is one of a contact, a gate electrode, or third wiring.

4. The semiconductor device according to claim 3, wherein
the first protecting element is one of a ground or a diode, and
the ground is connected to the semiconductor layer.

5. The semiconductor device according to claim 4, wherein
the conductive member and the first wiring are electrically separated from each other.

6. The semiconductor device according to claim 5, wherein the conductive member comes into contact with the lateral surface of the via at a position closer to a processing surface than a position at which the first wiring comes into contact with the bottommost surface of the via.

7. The semiconductor device according to claim 5, wherein
the conductive member is formed so as to surround a periphery of the lateral surface of the via or formed so as to come into contact with a part of the lateral surface of the via.

8. The semiconductor device according to claim 5, wherein
the lateral surface of the via is covered with an insulating film and covers the conductive member.

9. The semiconductor device according to claim 5, wherein
the conductive member is connected to a forward diode serving as the first protecting element, and
the forward diode is a diode having an N-type substrate or an N-type well and having a P-type surface injection layer.

10. The semiconductor device according to claim 5, wherein
the conductive member is connected to a reverse diode serving as the first protecting element, and
the reverse diode is a diode having a P-type substrate and an N-type surface injection layer.

11. The semiconductor device according to claim 5, wherein
the conductive member is the gate electrode, and
the gate electrode at least partially includes an injection layer made of a prescribed injection ion species or a metal layer made of a prescribed metal material.

12. The semiconductor device according to claim 1, further comprising a circuit that includes a transistor and a second protecting element, wherein
the second protecting element protects the transistor,
the first layer is a silicon substrate,
the second layer is an interlayer film,
the first wiring is in the interlayer film, and
the first wiring is connected to the circuit.

* * * * *